(12) United States Patent
Fukuda et al.

(10) Patent No.: US 6,479,899 B1
(45) Date of Patent: Nov. 12, 2002

(54) SEMICONDUCTOR INTEGRATED CIRCUIT DEVICE AND PROCESS FOR MANUFACTURING THE SAME

(75) Inventors: Takuya Fukuda, Kodaira (JP); Nobuyoshi Kobayashi, Kawagoe (JP); Yoshitaka Nakamura, Oume (JP); Masayoshi Saito, Hachiouji (JP); Shinichi Fukada, Hino (JP); Yoshifumi Kawamoto, Tsukui-gun (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/051,978

(22) PCT Filed: Sep. 18, 1996

(86) PCT No.: PCT/JP96/02686

§ 371 (c)(1),
(2), (4) Date: Apr. 24, 1998

(87) PCT Pub. No.: WO97/15950

PCT Pub. Date: May 1, 1997

(30) Foreign Application Priority Data

Oct. 27, 1995 (JP) .............................................. 7-280957

(51) Int. Cl.[7] .................. H01L 23/48; H01L 29/40; H01L 27/108; H01L 29/76; H01L 31/119
(52) U.S. Cl. .................. 257/758; 257/296; 257/300; 257/306
(58) Field of Search ................... 257/295–313, 257/758–764; 438/243–254, 396–399; 361/303–305, 311, 321.3

(56) References Cited

U.S. PATENT DOCUMENTS

| | | | | | |
|---|---|---|---|---|---|
| 5,471,093 A | * | 11/1995 | Cheung | ...................... | 257/758 |
| 5,501,999 A | * | 3/1996 | Park | ........................... | 438/253 |
| 5,578,847 A | * | 11/1996 | Aoki et al. | ................. | 257/296 |

FOREIGN PATENT DOCUMENTS

| | | |
|---|---|---|
| JP | 3295270 | 12/1991 |
| JP | 4297065 | 10/1992 |
| JP | 6125059 | 5/1994 |
| JP | 6177130 | 6/1994 |
| JP | 6204427 | 7/1994 |
| JP | 8213563 | 8/1996 |
| JP | 8186235 | 10/1996 |

* cited by examiner

*Primary Examiner*—Minh Loan Tran
*Assistant Examiner*—Cuong Q Nguyen
(74) *Attorney, Agent, or Firm*—Antonelli, Terry, Stout & Kraus, LLP

(57) ABSTRACT

The new structure of a memory cell which enables avoiding the problem of a step without increasing the number of processes, the structure of a semiconductor integrated circuit in which a common part of the same substrate in a manufacturing process is increased and the structure of the semiconductor integrated circuit which allows measures for environment obstacles without increasing the number of processes are disclosed. Memory cell structure in which a capacitor is formed in the uppermost layer of plural metal wiring layers by connecting the storage node of the capacitor to a diffusion layer via plugs and pads is adopted. It is desirable that a dielectric film formed in a metal wiring layer under the uppermost layer and a supplementary capacitor composed of a storage node and a plate electrode are connected to the capacitor. It is also desirable that the plate electrode of the capacitor covers the chip.

13 Claims, 17 Drawing Sheets

FIG. 2
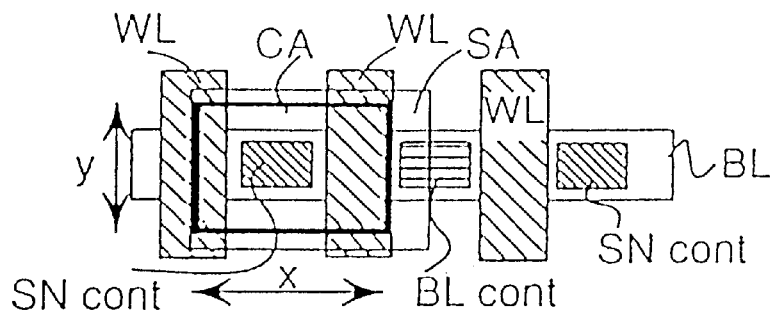
FIG. 3
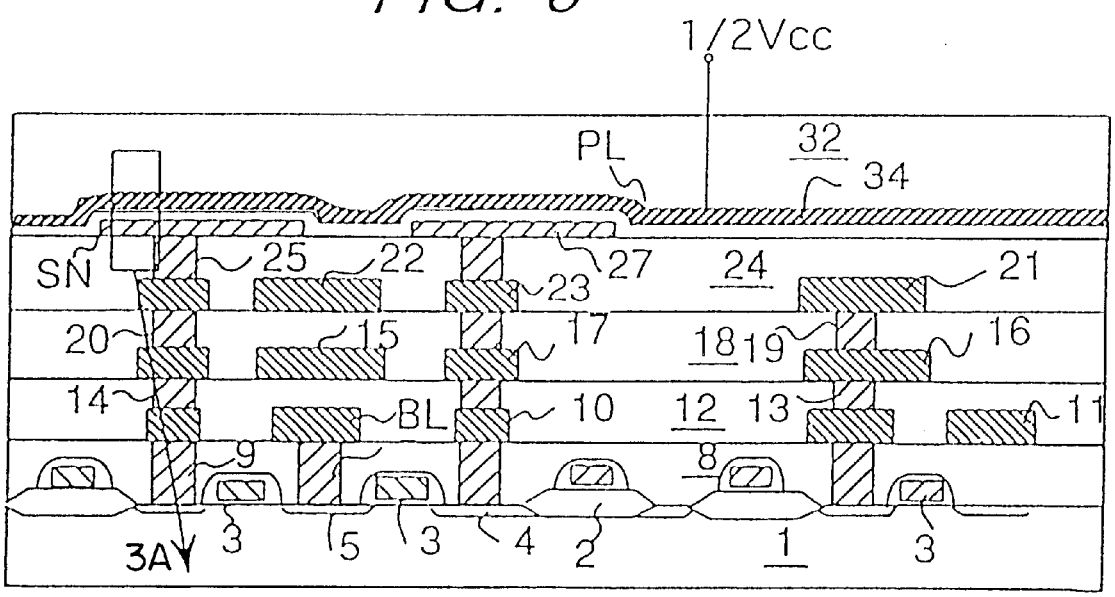
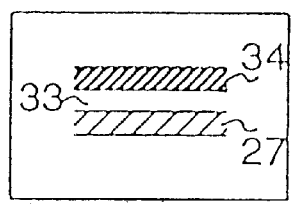
FIG. 3A

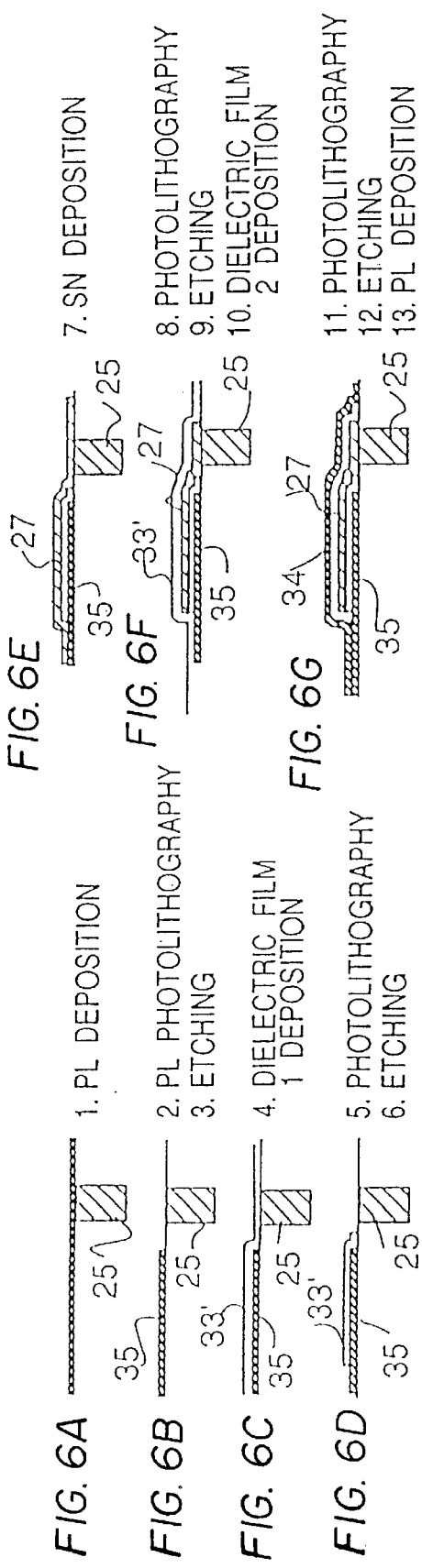

FIG. 24
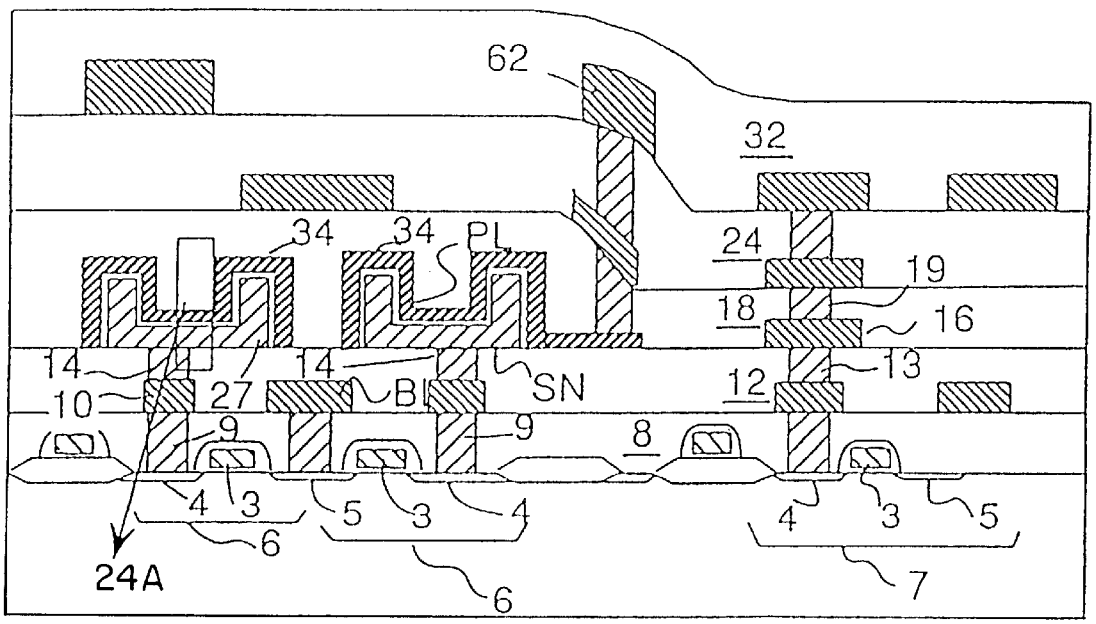
FIG. 24A
FIG. 25
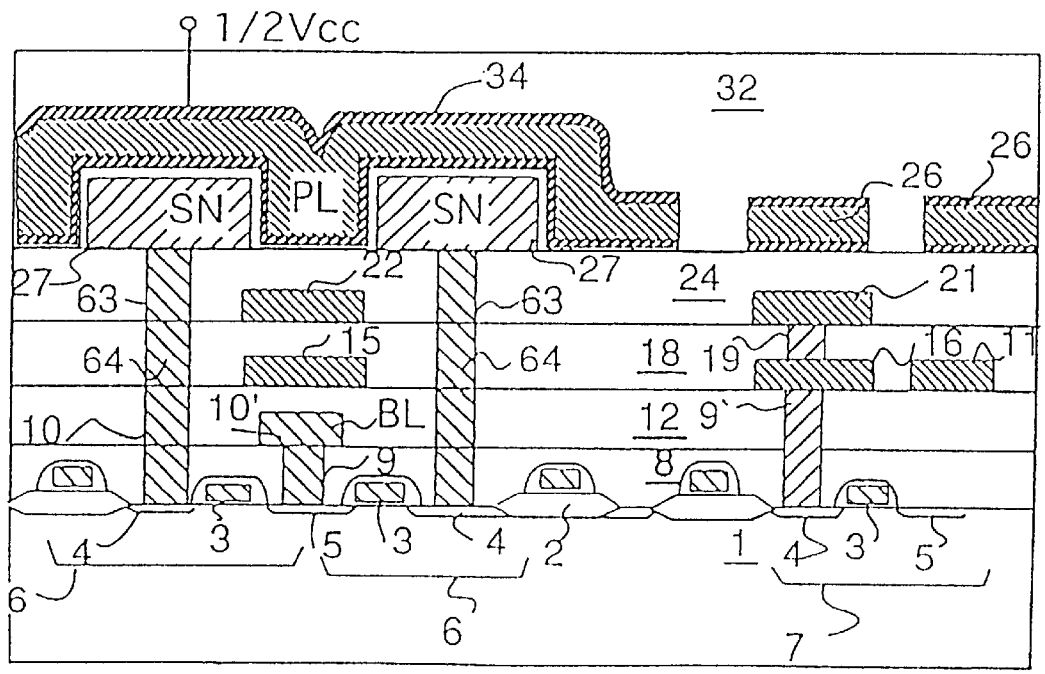

A method of forming a capacitor on a wiring layer to reduce the difference in a level due to a capacitor as disclosed in Japanese Patent Laid-open (Kokai) No. Hei6-125059 is proposed. In this method, a connecting hole collectively through a wiring layer and a bit line layer is formed by etching to connect the storage node of the capacitor formed on the wiring to a diffusion layer. Afterward, the storage node and the diffusion layer are connected by embedding polysilicon in the connecting hole. The hole which is 2 μm or more in depth with the aspect ratio of 8 or more is formed by dry etching. However, only a hole which is 2 μm or less in depth with the aspect ratio of 4 or less can be etched with a high yield and reproductivity by current dry etching technique. Therefore, there is a problem that the capacitor cannot be formed on wiring.

As the manufacturing process of the peripheral circuit is not considered, there is also a problem that the number of

SEMICONDUCTOR INTEGRATED CIRCUIT DEVICE AND PROCESS FOR MANUFACTURING THE SAME

FIELD OF THE INVENTION

The present invention relates to a semiconductor integrated circuit device provided with a dynamic random access memory (DRAM) and process for manufacturing it, particularly relates to a semiconductor integrated circuit suitably applied in case it is constituted by a large scale integrated circuit (LSI) and a method of manufacturing it.

BACKGROUND ART

The integration of DRAM of semiconductor integrated circuits is remarkably developed. An integrated circuit provided with high functions in which DRAM includes a logical circuit is realized. DRAM is composed of plural memory cells arrayed in a matrix composed of rows and columns on a semiconductor substrate. The memory cell is composed of a storage capacitor for storing information and a MOS field effect transistor (hereinafter called a MOS transistor) for controlling the input/output of an electric charge to/from the capacitor.

The capacitor is provided with structure in which a dielectric film is held between two electrode films and the MOS transistor is composed of a gate electrode and two diffusion layers (a drain area and a source area). One electrode film of the capacitor is connected to one diffusion layer of the MOS transistor and the other electrode film of the capacitor is connected to a constant-voltage power source. The on and off states of the MOS transistor are controlled by voltage applied to the gate electrode, when the electric charge is supplied from the other diffusion layer to the capacitor in the on state, writing is executed and in the other on state, the electric charge stored in the capacitor is extracted from the other diffusion layer.

DRAM is composed of plural memory cells, and one of which is constituted so that the gate electrodes in each row are connected via an individual word line and the other diffusion layers in each column are connected via an individual bit line. A peripheral circuit for controlling memory cells in DRAM is provided. Wiring between the memory cell and the peripheral circuit in addition to the word line, the bit line and internal wiring in the memory cell are formed by a metal wiring layer. As the capacity of DRAM is increased, the number of the wiring layers is increased. The capacitor is formed inside the intermediate layers of such plural wiring layers.

As the degree of integration becomes higher to increase the memory capacity of DRAM, the size of each part becomes smaller and the projective area (the area viewed from the top of the integrated circuit) of the capacitor decreases. In the meantime, as for the capacitor, the capacity to some extent is required to be secured, the substantial area of the capacitor is increased in addition in that material high in a dielectric constant is used and a dielectric layer is thinned. As the former two have a limit, various devices are made so that the substantial area is increased without increasing the projective area. To increase the area, the capacitor is often formed utilizing the height by increasing the thickness of the wiring layer in which the capacitor is arranged. A multilayer type and others can be given in addition to crown structure (cylindrical structure) and fin structure as the example.

However, as the thickness of the capacitor layer in which the capacitor is formed is increased, it cannot be avoided that difference is made between the memory cell portion and the peripheral circuit without the capacitor. (For example, see pages 42 to 44 in "Nikkei Microdevice" No. 117 published in March, 1995 by Nikkei B P, Japan.) FIG. 24 shows a general example of structure with difference in a level. In the example, MOS transistors 6 which respectively function as a memory cell and a transistor 7 which functions as a peripheral circuit are formed. A bit line layer 12 and three wiring layers 18, 24 and 32 are formed on a passivated insulating film layer 8 in which the gate electrodes 3 of both are formed.

The capacitor is formed in a first wiring layer 18 in crown structure. The capacitor is formed so that a dielectric film 28 is held between a lower metal film 27 (hereinafter called a storage node (SN)) and an upper metal film 34 (hereinafter called a plate electrode (PL)) as shown in an enlarged drawing in the lower part of FIG. 24. The storage node 27 is connected to the diffusion layer 4 of the MOS transistor 6 via a contact plug 9, a plug 14 and a pad 10, and the plate electrode 34 is connected to a wire 62 for supplying constant voltage in a third wiring layer 32 via plugs and a pad in the first and second wiring layers 18 and 24.

In the above example of the conventional type, as the capacitor is required to be in crown structure and high, there is difference in a level between the memory cell area and the peripheral circuit area. When the difference in a level exceeds a certain degree, there is a problem that in lithographic processing afterward, it is difficult to form a wiring pattern in a predetermined shape. The cause is the depth of the focus of an exposure apparatus. If the difference in a level exceeds the allowable range of the depth of the focus, the focus is off in a part with the difference in a level, luminous energy decreases, exposure is short and a predetermined shape is not formed. Particularly, when the difference in a level exceeds 1 μm, the problem is remarkable.

To solve the above problem, a method of forming a sacrificed film overall and reducing the quantity of the difference in a level by etching or polishing the film may be adopted. However, in that case, the number of processes is increased. If a connecting hole is formed, both an area in which etching is excessive and an area in which etching is short are made because the depth of the connecting hole up to a metal film is different in the part with the difference in a level. Particularly in the part in which the hole is deep, the shortage of etching and the failure of the conduction of the wire caused by the filling shortage of conductive material. Therefore, the problem of the difference in a level occurs in the semiconductor integrated circuit including DRAM and the logical circuit.

processes is increased for example because the formation of the connecting hole and a contact plug for connecting the storage node and the diffusion layer is independent from the formation of the connecting hole and the plug in the peripheral circuit portion.

Further, as a polysilicon plug is formed after wiring is formed, the temperature of 500° C. or more which is polysilicon forming temperature is applied to the wiring and the aluminum is deformed and decomposed if aluminum is used for wiring material As described above, the structure of the capacitor is complicated because of fining, the number of processes is increased and the above complication is the main cause of the increased manufacturing cost. In addition, since the capacitor, the wiring of the peripheral circuit and the wiring of a logical circuit in a layer in which the capacitor is arranged are respectively formed in the different process, the number of processes is remarkably increased, compared with that in case they are separately formed. The increase of the number of processes causes the deterioration of a yield.

There are a method of applying an organic protection film and methods of applying voltage equivalent to the stress of a hot carrier to a chip for preventing the radiation to a chip as a measure for a soft error caused by the radiation such as alpha rays and others (see the twenty-fifth page of "VLSI Manufacturing Technique" written by T. Tokuyama, et al and published in January, 1989 by Nikkei B P, Japan). In the former, the process for coating is separately required, and in the latter, the manufacturing process for forming the electrode for applying voltage is increased and the effect is reduced by the movement of electric charges after application and the aging change of discharge and others. Both methods produce no effect upon the other environment obstacles such as induced noise.

DISCLOSURE OF THE INVENTION

A first object of the present invention is to provide new memory cell structure in which the problem of a step can be avoided without increasing the number of processes.

A second object of the present invention is to provide the structure of an integrated circuit in which a common part in the manufacturing process of the same substrate is increased.

Further, a third object of the present invention is to provide the structure of an integrated circuit in which measures for environment obstacles can be taken without increasing the number of processes.

In the present invention, the above problems can be solved by forming a capacitor in the uppermost layer of plural metal wiring layers and successively connecting a contact plug to a diffusion layer formed in a passivated insulating film layer, a pad and a plug formed in a bit line layer and a pad and a plug formed in each metal wiring layer on the bit line layer respectively for the connection of the storage node of the capacitor and the diffusion layer of a transistor. For the above pad in the bit line layer, the same vertical structure (structure in which plural types of metal films are laminated) and the same material as the bit line, and the wire and the pad of the metal wiring layer of the peripheral circuit portion formed together with the bit line layer are adopted. Further, for the above plug in the bit line layer, the same material as the plugs for the metal wiring layer in the peripheral circuit portion is used. For the above pad in each metal wiring layer on the bit line layer, the same vertical structure and the same material as the wire in the memory cell portion in each metal wiring layer and the wire and the pad in the peripheral circuit portion formed in each metal wiring layer are adopted. Further, for the above plugs in each metal wiring layer, the same material as the plugs in the peripheral circuit portion is used.

As described above, since the connection of the storage node to the diffusion layer can be formed simultaneously with other wiring and interlayer connection, a high yield can be obtained and the increase of the number of processes can be avoided.

For example, a tungsten film (which reacts upon silicon at the temperature of 500° C. or more and the contact resistance of which is increased) can be provided on a diffusion layer by using tungsten and aluminum which can be used at the temperature of 500° C. or less for a pad and a plug and lower contact resistance can be realized. As aluminum can be used for wiring, the resistance of wire can be reduced, the operating speed of an integrated circuit can be increased.

Further, the high-frequency characteristic of a transistor can be kept with it the initial characteristic by adding a manufacturing process at the temperature of 500° C. or less to processes after a diffusion layer is formed. When temperature exceeds 500° C., the diffusion is again accelerated, the diffusion layer area is widened and the high-frequency characteristic of the transistor is deteriorated. However, if temperature is at 500° C. or less, such a problem is not caused.

The above method of adding the manufacturing process at the temperature of 500° C. or less to processes after the diffusion layer is formed can be applied to not only above DRAM but the whole semiconductor integrated circuit provided with a diffusion layer.

In a method according to the present invention, the thickness of each wiring layer except the uppermost layer is approximately equal, and the wires in the memory cell portion and the peripheral circuit can be simultaneously and in common processed. In addition, the plate electrode of the capacitor and the wire of the peripheral circuit can be simultaneously and in common processed even if difference in a level exists because no connecting hole is formed in the uppermost layer. The manufacturing process in common can be shared also in the integrated circuit including DRAM and the logical circuit.

Since the capacitor is formed after a final wiring process in the memory cell portion, the layout of the connecting hole among wiring layers is not required to be considered and the capacitor can be formed on the approximately overall surface of the memory cell. Since the area of the capacitor is increased, simple structure (a planar type) in which the dielectric layer is held between the two layers of the storage node and the plate electrode can be adopted for a capacitor.

Further, since the plate electrode is provided to supply constant voltage common to the whole capacitor, it can cover the approximately overall surface of a chip including the peripheral circuit in addition to the memory cell portion. In the meantime, since the plate electrode is formed by metal, a radiation, an external electromagnetic wave which is the cause of the noise and others are noise are cut off by the electrode and the whole chip is protected. Hereby, measures for an environment obstacle can be taken without increasing the number of processes. In the integrated circuit including DRAM and the logical circuit, the plate electrode for supplying the power source can be also provided in the uppermost layer of the logical circuit and the enhancement of the resistance to the environment obstacle of the logical circuit is also achieved by covering the overall surface of the logical circuit with the electrode.

If the capacity of a single capacitor is short, it is desirable that a supplementary capacitor is formed in a wiring layer under the uppermost layer. The problem of a step is avoided by setting the height of the supplementary capacitor to approximately the same height as the wiring of the peripheral circuit and the logical circuit. Through such a supplementary capacitor, as will be described in detail later, it can be realized by planar structure and structure utilizing the side of the storage node and the plate electrode.

BRIEF DESCRIPTION OF THE DRAWINGS

FIG. 2 is a plan view for explaining the planar structure of the circuit shown in FIG. 1;

FIG. 3 is a sectional structural view for explaining a second embodiment of the present invention;

FIG. 6 is a view explaining a process for manufacturing a supplementary capacitor in the third embodiment;

FIG. 24 is a sectional structural view for explaining an example of conventional type semiconductor integrated circuit and method of manufacturing it;

FIG. 25 is a sectional structural view for explaining an example of conventional type semiconductor integrated circuit and method of manufacturing it.

BEST MODE FOR CARRYING OUT THE INVENTION

Figure 1:
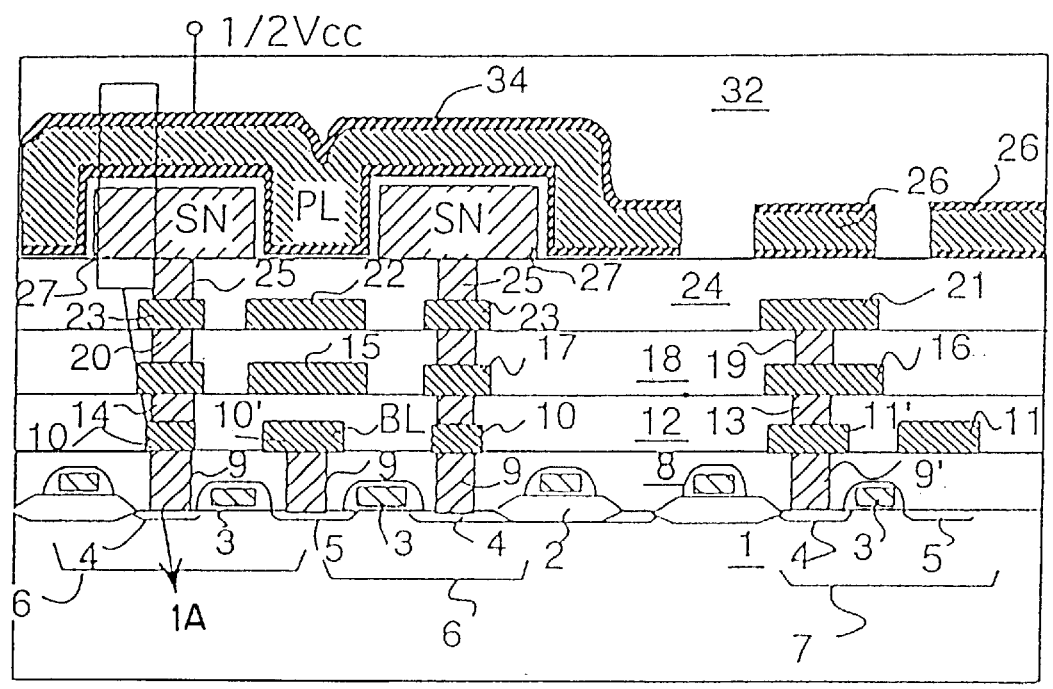
FIG. 1 is a sectional structural view for explaining a first embodiment of a semiconductor integrated circuit device and process for manufacturing it according to the present invention.
Figure 1A:
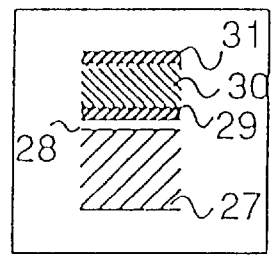

Referring to embodiments shown in the drawings, a semiconductor integrated circuit device and process for manufacturing it respectively according to the present invention will be described further in detail. The same reference number in FIGS. 1 to 26 denotes the same material or the similar material.

<First Embodiment>

FIG. 1 shows the sectional structure of two memory cells and a part of a peripheral circuit. As shown in FIG. 1, a reference number 1 denotes a P-type silicon substrate, 2 denotes a field oxide film, 3 denotes a gate electrode, 4 and 5 denote diffusion layers, 6 denotes a transistor constituting a memory cell portion, 7 denotes a MOS transistor constituting a peripheral circuit, 8 denotes a passivated insulating film layer for protecting each MOS transistor, 12 denotes a bit line layer (a metal wiring layer in the peripheral circuit), 18, 24 and 32 respectively denote first, second and third metal wiring layers, 9 denotes a contact plug for interlayer connection in the memory cell portion in the passivated insulating film layer 8, 14, 20 and 25 respectively denote a plug for interlayer connection in the memory cell portion, 10, 17 and 23 respectively denote a connecting pad in the memory cell portion, 10' denotes a bit line (BL), 15 and 22 respectively denote a wire in the memory cell portion, 9' denotes a contact plug for interlayer connection in the peripheral circuit portion in the passivated insulating film layer 8, 13 and 19 respectively denote a plug for interlayer connection in the peripheral circuit portion, 11' denotes a connecting pad in the peripheral circuit portion, 11, 16, 21, and 26 respectively denote a wire in the peripheral circuit portion, 27 denotes a storage node (SN) of a capacitor and 34 denotes a plate electrode (PL) of the capacitor.

FIG. 2 is a top view (an exploded drawing) showing the memory cell portion. One memory cell is formed in a part shown as a plane SA and the capacitor is formed in the range of a plane CA of projection. In FIG. 2, three word lines WL are shown in the direction of a column, one bit line BL is shown in the direction of a row, two storage node (SN) connections are shown and one bit line (BL) connection is shown. In this embodiment, the memory capacity of DRAM is set to 256 Mbits and the dimensions x and y of the plane of projection which the capacitor constitutes are respectively set to 0.85 $\mu$m and 0.65 $\mu$m.

Next, referring to FIG. 1, a method of forming the memory cell will be described. First, the field oxide film 2 is formed on the P-type silicon substrate 1 by selective oxidation and the transistor 6 composed of the gate electrode 3 and the diffusion layers 4 and 5 and the adjacent transistor 7 are formed in a predetermined place. The field oxide film 2 is arranged between the transistors 6 and 7. An insulating film (a silicon oxide film including phosphorous and boron) is formed on the overall surface of the substrate 1 and thermal annealing at the temperature of 750° C. is applied for reflowing. Hereby, a step formed by the field oxide film 2 between the transistors 6 and 7 is reduced. Further, to reduce the step, chemical mechanical polishing method is applied. The flattened passivated insulating film layer 8 is formed by the above process.

Next, connecting holes are formed in the insulating layer, and the contact plug 9 for connection to the bit line (BL) 10', the contact plug 9 for connection to the storage node (SN)

27 and the contact plug 9' for connection to the peripheral circuit wires 16 and 21 (for the main material of the plugs, tungsten is used, however, polysilicon may be also used) are formed. The bit line 10', the pad 10 for connection to the storage node 27, the pad 11' for connection to the wires 16 and 21 and the wire 11 are formed. At this time, the bit line 10', the pads 10 and 11' and the wire 11 are simultaneously formed so that they have the same structure in which TiN, Al and TiN are laminated. After the pads and the wires in the bit line layer (the metal wiring layer in the peripheral circuit portion) 12 are formed, an insulating film which is mainly made of silicon dioxide (SiO$_2$) is successively formed overall by plasma chemical vapor deposition (plasma CVD) and further, the insulating film is flattened by chemimechanical polishing.

Next, connecting holes are formed in the insulating film, and the plug 14 for connection to the pad 17 and the plug 13 for connection to the wire 16 (the main material of both plugs is tungsten) are formed. After the wires 15 and 16 and the pad 17 in the first metal wiring layer 18 are formed, the flattened insulating film equivalent to the first metal wiring layer 18 is formed by the same method as the above one.

Next, connecting holes are formed in the insulating film, and the plug 19 for connection to the wire 21 and the plug 20 for connection to the pad 23 are formed. After the wires 21 and 22 and the pad 23 in the second metal wiring layer 24 are formed, the flattened insulating film equivalent to the second metal wiring layer 24 is formed according to the same procedure as the above one. Afterward, the plug 25 for connection to the storage node 27 is formed. In the above process, processing temperature except that for reflowing in the passivated insulating film is 450° C. or less.

Next, the capacitor is formed according to the following procedure and the uppermost layer 32 of the wiring layers is formed.

1. First, tungsten W is deposited up to the thickness of 0.50 $\mu$m by sputtering (may be also deposited by CVD),
2. exposure and development by photolithography are performed and
3. the storage node 27 with the dimensions of 7 $\mu$m×0.5 $\mu$m is formed on the connecting plug 25 by dry etching. According to the these dimensions, the storage node 27 is separated from an adjacent storage node by 0.3 $\mu$m.
4. Next, tantalum pentoxide (Ta$_2$O$_5$) is deposited by CVD and
5. exposure and development by photolithography are performed. In the photolithography at this time, a focus has only to be brought on the tantalum pentoxide film on the flattened insulating film of the metal wiring layer 24.
6. Next, a part except a required part is removed by dry etching and the tantalum pentoxide film 28 shown in an enlarged drawing in the lower part of FIG. 1 to be the dielectric film of the capacitor is formed.
7. Further, a titanium nitride (TiN) film 29 is formed according to the same procedure as a method of forming the lower wiring layers 8, 12, 18 and 24,
8. an aluminum (Al) film 30 is formed on the titanium nitride film and
9. A titanium nitride film 31 is again formed on the aluminum film.
10. Next, exposure and development by photolithography are performed. As a connecting hole is not formed later in the wire material on the step also in the photolithography at this time, a focus has only to be brought on the titanium nitride film 31.
11. Next, a wire with structure in which TiN, Al and TiN are laminated is formed by dry etching. A wire over the storage node 27 is the plate electrode (PL) 34 and the wire 26 over the peripheral circuit. That is, the plate electrode 34 of the capacitor and the wire 26 of the peripheral circuit are simultaneously formed using the same mask. Constant voltage equivalent to a half of supply voltage Vcc is supplied to the plate electrode 34. As the area of the above capacitor is set to 1.55 $\mu$m$^2$ and tantalum pentoxide with of 1.6 nm in the silicon dioxide equivalent thickness is used, the capacity of the capacitor is set to 22 femtofarad (fF). The capacity is equal to the capacity of a capacitor required for 256 Mbits.

The number of processes is eleven as described above. The above processing temperature is 450° C. or less. In the meantime, in an example of a conventional type shown in FIG. 24, twenty processes are required. This is because a complicated process is required for the capacitor and another process is required for forming the wire 26 after the capacitor is formed (The details of processes in the example of the conventional type will be collectively described later).

The structure of a conventional type shown in FIG. 25 requires extra processes by six or more processes in a process before the capacitor is manufactured and in addition, as a connecting hole 63 cannot be processed by dry etching and diffusion layers 4 and 5 are etched even if the connecting hole is formed, a transistor is not operated and a manufacturing yield is zero. (The details of the processes of the conventional types will be collectively described later.)

The characteristics of the present invention will be collectively described below, compared with those of the prior art.

1) As the capacitor is formed in the uppermost layer and the wiring layers of the memory cell and the peripheral circuit are formed on the same plane, no problem of the step occurs in lithography.

2) As the diffusion layer and the electrode of the capacitor are connected via the plugs and the pads, the capacitor can be formed in the uppermost layer without increasing the number of processes. Therefore, as the overall surface of the memory cell can be utilized as the capacitor area, capacity can be secured with simple capacitor structure and the number of processes can be reduced. As a connecting hole to the plate electrode 34 is not required to be formed, no problem of the step occurs in lithography.

3) As the plate electrode 34 of the capacitor and the wire 26 of the peripheral circuit are simultaneously formed, the number of processes can be reduced.

The above characteristics relates to DRAM of 256 Mbits, however, the same characteristics can also be acquired in DRAM of 64 Mbits and DRAM of 1 or more Gbits.

The capacitor manufacturing process and the manufacturing process of a wiring layer 18 in which the capacitor is arranged in the conventional type shown in FIG. 24 will be described below. The memory capacity of DRAM is set to the 256 Mbits as the same in this embodiment.

1. First, tungsten is deposited by CVD until the film is 0.2 $\mu$m thick,
2. exposure and development by photolithography are performed and
3. the lower electrode of a storage node 27 is formed by dry etching. Next, to form the side electrode of the storage node 27,
4. silicon dioxide is deposited until the film is 0.3 $\mu$m thick,
5. exposure and development by photolithography are performed and 6. the cylindrical block of the silicon dioxide film with the dimensions of 0.4 μm×0.4 μm is formed by dry etching.

7. In addition, a tungsten film is formed by CVD, 8. the side electrode is formed on the side wall of the silicon dioxide block by etchback and 9. the silicon dioxide film is removed.

10. Next, tantalum pentoxide is deposited by CVD, 11. exposure and development by photolithography are performed, 12. a dielectric film 28 is formed by removing the tantalum pentoxide film except the required part by dry etching, 13. a titanium nitride film 0.1 μm thick is deposited overall, 14. a part pulled out from a plate electrode 34 is coated with a resist by photolithography, 15. the plate electrode 34 is formed by etchback and a capacitor with the dimensions of 0.5 μm×0.5 μm is formed on a connecting plug 14.

16. Afterward, a titanium nitride film is deposited to form the wire 16 of a peripheral circuit, 17. an aluminum film is deposited, 18. a titanium nitride film is deposited, 19. exposure and development by photolithography are performed and 20. the wire 16 with structure in which TiN, Al and TiN are laminated is formed by dry etching.

As described above, twenty processes are required until the formation of the wire of the peripheral circuit is finished.

Next, referring to FIG. 25, a method of forming a memory cell in which a capacitor is arranged on a wiring layer according to prior art will be described. First, a field oxide film 2 is formed on a P-type silicon substrate 1 by selective oxidation and a transistor 6 composed of a gate electrode 3 and diffusion layers 4 and 5 and an adjacent transistor 7 are formed in a predetermined location. The field oxide film 2 is arranged between the transistors 6 and 7. Next, an insulating film (a silicon oxide film including phosphorous and boron) is formed on the overall surface of the substrate 1 and thermal annealing at the temperature of 750° C. is applied to the insulating film for reflowing. Hereby, difference in a level based upon the field oxide film 2 between the transistors 6 and 7 is reduced.

Next, a connecting hole is formed in the insulating film and a contact plug 9 (polysilicon) to a bit line (PL) 10' is formed. Next, the bit line 10' (polysilicon) is formed. After a pad and a wire in the bit line layer 12 are formed, an insulating film which is mainly made of silicon dioxide (SiO$_2$) is formed overall by CVD. An insulating film (a silicon oxide film including phosphorous and boron) is formed on the overall surface of the substrate 1 and thermal annealing at the temperature of 750° C. is applied for reflowing. Hereby, difference in a level based upon the bit line is reduced.

a) Next, a connecting hole for a peripheral circuit is formed in the insulating film of the bit line layer 12 and the insulating film layer 8 under it and b) a contact plug 9' which is mainly made of tungsten to a pad 16 is formed. Next, after a wire 15 in a first metal wiring layer 18 and a wire 11 in the peripheral circuit portion are formed, an oxide film is deposited overall by plasma CVD, the surface is flattened by applying a resist to irregularities based upon the wires and the flattened insulating film of the first wiring layer 18 is formed by applying etchback to the above surface.

c) Next, a connecting hole to a wire 21 in the peripheral circuit portion is formed and d) a plug 19 for wiring in the peripheral circuit portion is formed. Next, after a wire 22 in a second metal wiring layer 24 and a wire 21 in the peripheral circuit portion are formed, the flattened insulating film of the second wiring layer 24 is formed according to the same procedure as the above one.

e) Afterward, a connecting hole 63 for connecting a storage node 27 and a diffusion layer 4 is formed and f) a contact plug 64 is formed. Polysilicon by thermal CVD is used for the contact plug 64 in consideration of embedding. Polysilicon forming temperature is 600° C. A capacitor is formed in the same process as in the present invention. As described above, as there are six extra processes in the example of the conventional type and further, the aspect ratio of the connecting hole 63 is large, the formation of the connecting hole in target structure is impossible.

<Second Embodiment>

A second embodiment of DRAM will be described below. FIG. 3 shows the structure. The second embodiment is different from the first embodiment in that the dielectric film of a capacitor is changed from tantalum pentoxide to lead zirconate titanate (PZT) higher in a dielectric constant, the structure of the capacitor is a simple planar type not utilizing the side and the approximately overall surface up to a peripheral circuit portion is coated with the plate electrode of the capacitor. As the structure in this embodiment until a second wiring layer 24 is formed before the capacitor is formed is formed by the same manufacturing method as in the first embodiment, the description is omitted.

The manufacturing process of the capacitor is as follows:

1. First, platinum (Pt) is deposited by sputtering until the film is 0.1 μm thick, 2. exposure and development by photolithography are performed and 3. a storage node (SN) 27 with the dimensions of 0.7 μm×0.5 μm is formed on a connecting plug 25 by dry etching. According to these dimensions, the storage node 27 is separated from an adjacent storage node by 0.3 μm.

4. Next, the above lead zirconate titanate is deposited by CVD using organic metal, 5. exposure and development by photolithography are performed, 6. the lead zirconate titanate except the required part is removed by dry etching and a lead titanate film 33 which is to be the dielectric film of the capacitor shown in an enlarged drawing in the lower part of FIG. 3 is formed.

7. Next, a platinum film 34 is formed on the lead titanate film, 8. exposure and development by photolithography are performed and 9. a plate electrode (PL) 34 is formed by dry etching.

As the area of the above capacitor is 0.35 μm$^2$ and the lead titanate of 0.36 nm in silicon dioxide equivalent thickness is used, the capacity of the capacitor is 22 fF. This capacity is equivalent to the capacity of a capacitor required for 256 Mbits. As described above, a planar type of capacitor which has a simple structure can be used by using the dielectric film which has the high dielectric constant and utilizing the overall memory cell surface of the capacitor in the uppermost layer as a capacitor area. Therefore, the number of processes can be further reduced. As the capacitor is formed so as to be thin, a flat final protective coat (passivated film) with little difference in a level can be formed.

Figure 4:
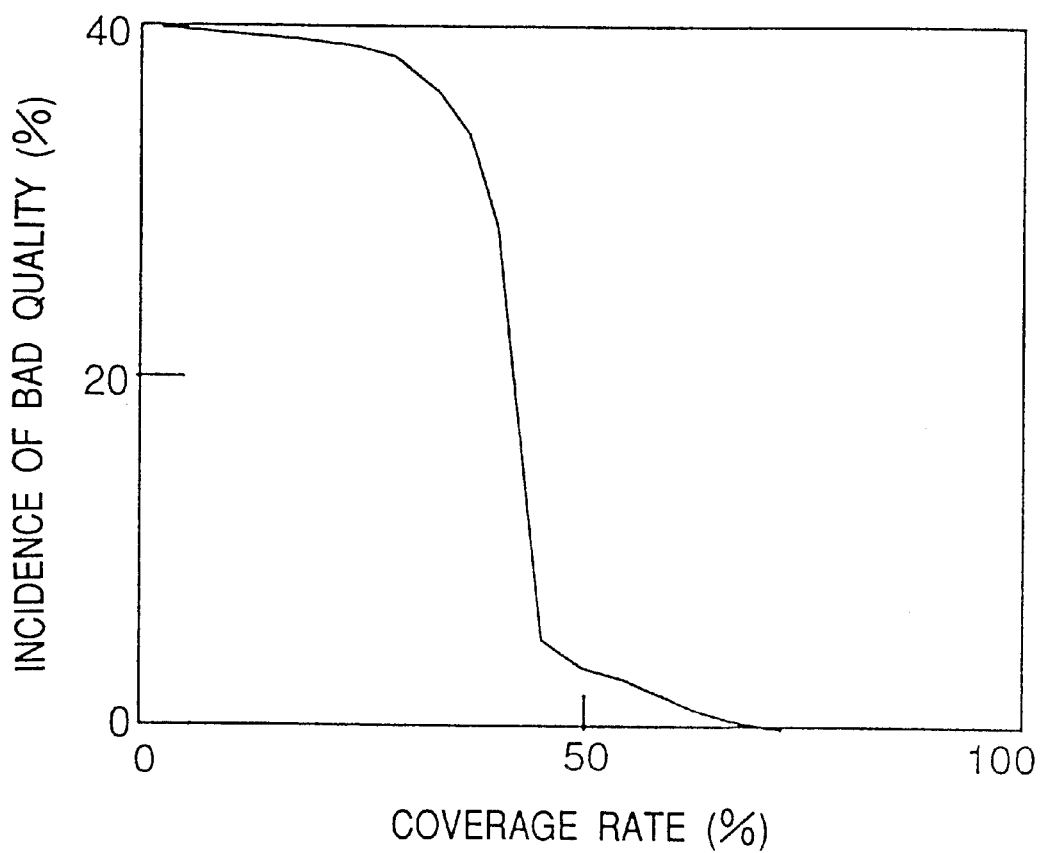
FIG. 4 shows a curve showing relationship between the coverage rate of the plate electrode of a capacitor and the incidence of bad quality caused by alpha rays.

The incidence of bad quality by a radiation (alpha rays) was investigated by producing DRAMs of which chip was covered with a plate electrode in various area ratio. FIG. 4 shows the result. The coverage rate of the conventional type of DRAM shown in FIG. 24 is 30%. It becomes clear that if the overall memory cell area is covered with the plate electrode (the coverage rate is 45% or more) even in the severe atmosphere of a radiation in which most of the conventional types are damaged, remarkable resistance can be obtained.

Heretofore, an organic protective film was required to formed as a chip protective film to avoid the above bad quality by a radiation. If the overall memory cell area is covered with the plate electrode, the above organic protective film is not required to be formed.

<Third Embodiment>

Figure 5:
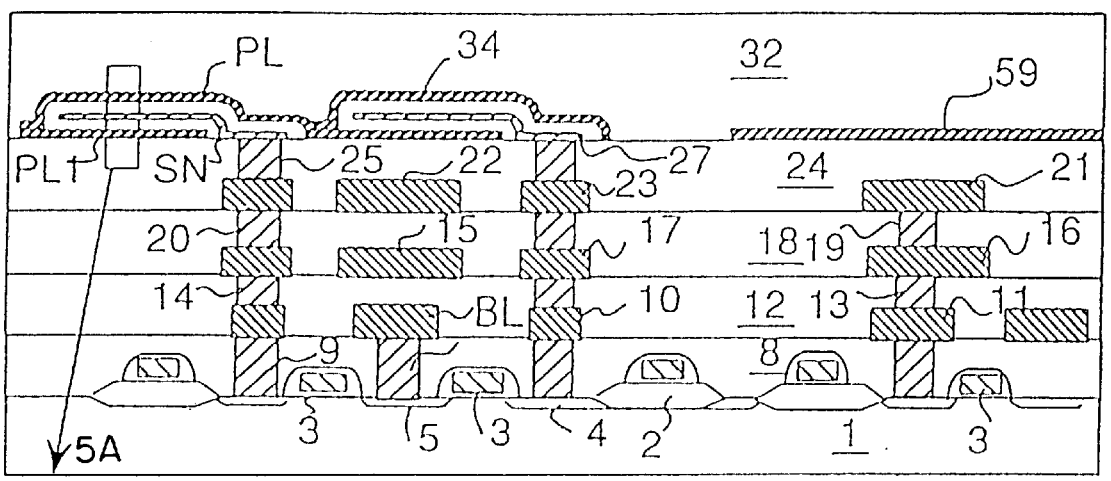
FIG. 5 is a sectional structural view for explaining a third embodiment of the present invention.
Figure 5A:
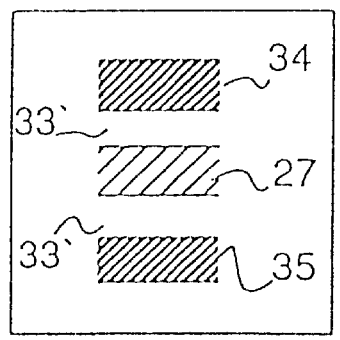

A third embodiment of DRAM will be described below. FIG. 5 shows the structure. The third embodiment is different from the second embodiment in that the structure of a capacitor is a two-layer planar type by changing the material of the dielectric film of the capacitor from lead titanate (of which effective film thickness is 0.36 $\mu$m) deposited by CVD using organic metal to lead titanate (of which effective film thickness is 0.50 $\mu$m) formed by simpler sputtering. Therefore, a plate electrode (PL) is divided into upper and lower two layers (35 and 34) and a storage node (SN) 27 is held between them. As the structure in this embodiment is formed by the same manufacturing method as in the first embodiment until a second wiring layer 24 is formed before the capacitor is formed, the description is omitted.

Referring to FIG. 6, the manufacturing process of the capacitor will be described below.

1. First, platinum is deposited for the plate electrode 35 by sputtering until the film is 0.1 $\mu$m thick,
2. exposure and development by photolithography are performed,
3. a lower plate electrode 35 with the dimensions of 0.7 $\mu$m×0.5 $\mu$m is formed next to a connecting plug 25 for a storage node 27 by dry etching (see FIG. 5 together with an enlarged drawing in the lower part of FIG. 5),
4. a lead titanate film 33' is deposited by sputtering,
5. exposure and development by photolithography are performed and
6. the lead titanate film except the required part is removed by dry etching.
7. Next, a platinum film for the storage node 27 is formed by sputtering,
8. exposure and development by photolithography are performed and
9. the storage node 27 with the dimensions of 0.7 $\mu$m×0.5 $\mu$m is formed by dry etching with the storage node connected to the connecting plug 25.
10. Next, a lead titanate film 33' is deposited by sputtering,
11. exposure and development by photolithography are performed and
12. the lead titanate film except the required part is removed by dry etching.
13. Afterward, a platinum film is deposited for a plate electrode 34 by sputtering,
14. exposure and development by photolithography are performed and
15. the plate electrode 34 is formed by dry etching with the plate electrode connected to the plate electrode 35 formed above.

The enlarged drawing showing the section of the capacitor is shown in the lower part of FIG. 5. As the area of the above capacitor is 0.5 nm² in the total of the upper and lower layers and a lead titanate film 0.5 nm thick in silicon oxide equivalent thickness is used, the capacity of the capacitor is 22 fF. This capacity is equivalent to the capacity of a capacitor required for 256 Mbits. As described above, the dielectric film which has the high dielectric constant is used, the capacitor is formed in the uppermost layer 32 and the approximately overall area of a memory cell can be utilized. Therefore, redetermined capacity can be secured by the simple planar type of two-layer capacitor without increasing the number of processes.

As described in this embodiment, large area can be obtained with simple structure in the vertical direction by constituting so that the storage node 27 is held between the plate electrodes 34 and 35. If the storage node is divided into two layers and the plate electrode is held between the two storage nodes, the similar effect can be also obtained.

<Fourth Embodiment>

Figure 7:
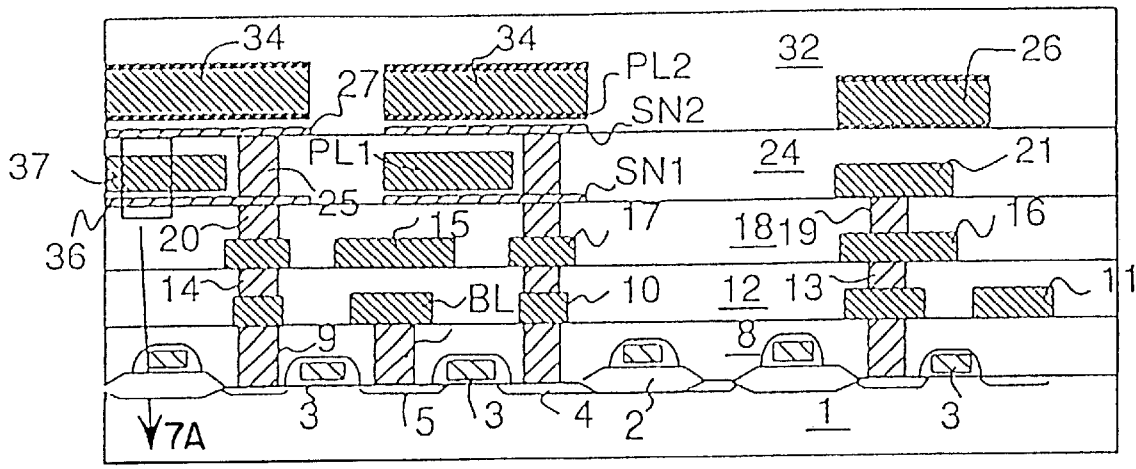
FIG. 7 is a sectional structural view for explaining a fourth embodiment of the present invention.
Figure 7A:
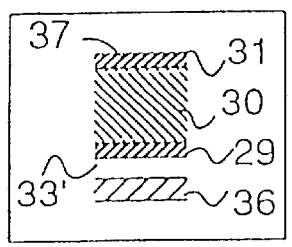

A fourth embodiment of DRAM will be described below. FIG. 7 shows the structure. The fourth embodiment is different from the third embodiment in that a supplementary capacitor is formed in a wiring layer 24 immediately under an uppermost layer 32, both the main and supplementary capacitors are a planar type, both capacitors are connected via a connecting plug and the plate electrodes 34 and 37 of both capacitors are simultaneously formed using the respective same masks as the wires 21 and 26 of a peripheral circuit in the respective same layers. As the structure in this embodiment is formed by the same manufacturing method as in the first embodiment until a second wiring layer 18 is formed before the capacitor is formed, the description is omitted.

Referring to FIG. 7, the manufacturing process of the supplementary capacitor will be described below.

1. First, a platinum is deposited for a lower storage node (SN) 36 formed in a wiring layer 24 by sputtering until the film is 0.1 $\mu$m thick,
2. exposure and development by photolithography are performed,
3. the lower storage node 36 with the dimensions of 0.7×$\mu$m×0.5 $\mu$m is formed on a connecting plug 20 by dry etching,
4. a lead titanate film 33' is deposited by sputtering,
5. exposure and development by photolithography are performed and
6. the lead titanate film except the required part is removed by dry etching.
7. Next, a titanium nitride film 9 is formed by depositing titanium nitride which is the material of a plate electrode (PL) 37 and a wire 21 in the lower layer 24 by sputtering (see an enlarged drawing in the lower part of FIG. 7),
8. an aluminum film 30 is formed by depositing aluminum by sputtering,
9. a titanium nitride film 31 is formed by depositing titanium nitride by sputtering again,
10. exposure and development by photolithography are performed both for the plate electrode 37 and the wire 21 and
11. after a hole is formed in a connecting plug 25 for the storage node 27 of the capacitor in the uppermost layer 32 by dry etching, the lower plate electrode 37 with the dimensions of 0.3 $\mu$m×0.5 $\mu$m and the wire 21 of the peripheral circuit are formed.

The following process is approximately equal to manufacturing in the first embodiment. The contents of the process in this embodiment are different from those in the above embodiments in the material of a dielectric film used for the capacitor and the shape of the capacitor (locations in which photolithography and dry etching are applied are different). The number of processes is the same.

As the area of the above capacitor is 0.50 $\mu m^2$ in the total of the upper and lower layers and lead titanate 0.5 nm thick in silicon oxide equivalent thickness is used, the capacity of the capacitor is 22 fF. This capacity is equivalent to that of a capacitor required for 256 Mbits. The number of processes in this embodiment is increased by five processes, compared with that in the example described in the first embodiment, however, it is smaller than the number in the prior art. This is because a part of the metal layer of the capacitor is formed simultaneously with the wiring layer so that the structure of the part is equal to that of the wiring layer. As the film which has the high dielectric constant is used, the structure of the capacitor can be a simple planar type. As described above, capacity can be secured by the simple planar type of two-layer capacitor using sputtering which is simple and suitable for mass production without increasing the number of processes. As the height of the capacitor in the uppermost layer 32 and that of the wire 26 in the peripheral circuit are approximately equal and difference in a level is little, a final protective film can be flattened.

<Fifth Embodiment>

Figure 8:
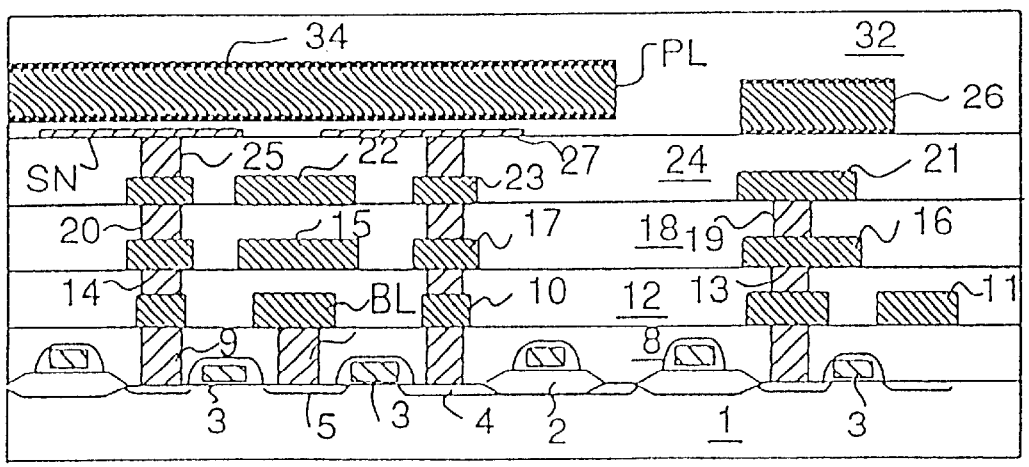
FIG. 8 is a sectional structural view for explaining a fifth embodiment of the present invention.

A fifth embodiment of DRAM will be described below. FIG. 8 shows the structure. The fifth embodiment is different from the fourth embodiment in that a supplementary capacitor is not used and a plate electrode 34 is formed on the overall surface of a memory cell portion. Hereby, as in the second embodiment, the resistance to environment obstacles is enhanced. In addition, effect that an insulating film to be formed in an uppermost layer 32 can be readily formed is produced. As in the fourth embodiment, the plate electrode can be processed every memory cell, however, as constant voltage is supplied to the plate electrode, the plate electrode can be shared without dividing into pieces. In that case, the formation of an insulating film in vacant space executed if the plate electrode is divided into pieces can be omitted.

<Sixth Embodiment>

Figure 9:
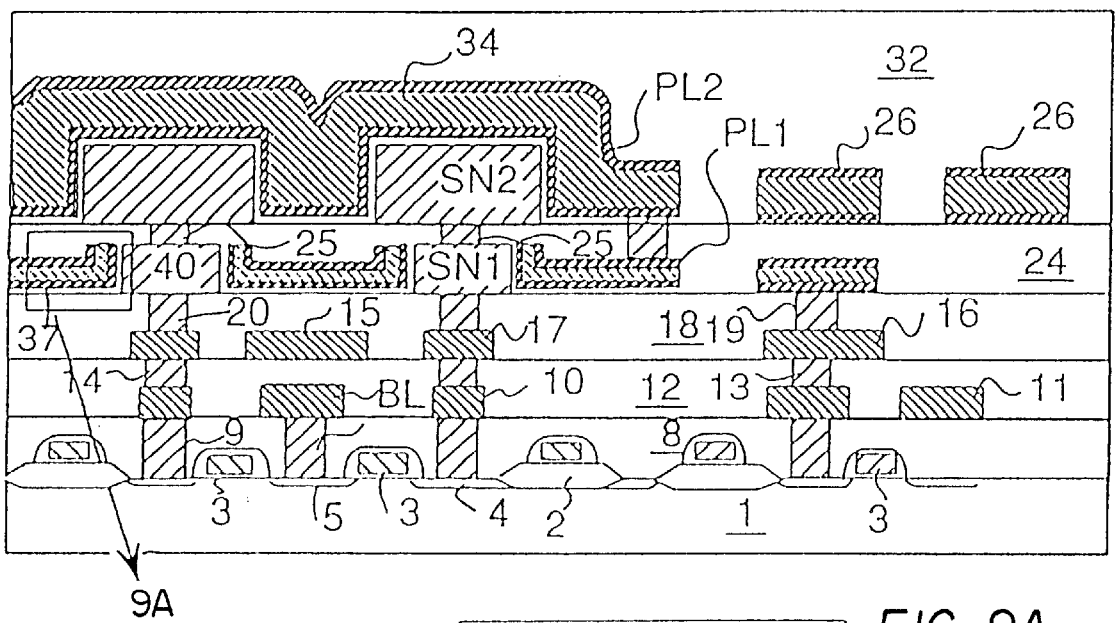
FIG. 9 is a sectional structural view for explaining a sixth embodiment of the present invention.
Figure 9A:
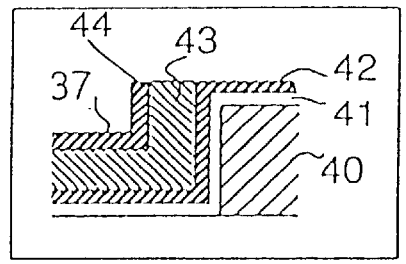
Figure 10A:
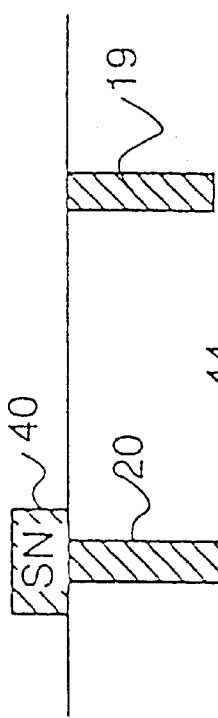
FIG. 10 is a view explaining a process for manufacturing a supplementary capacitor in the sixth embodiment.
Figure 10B:
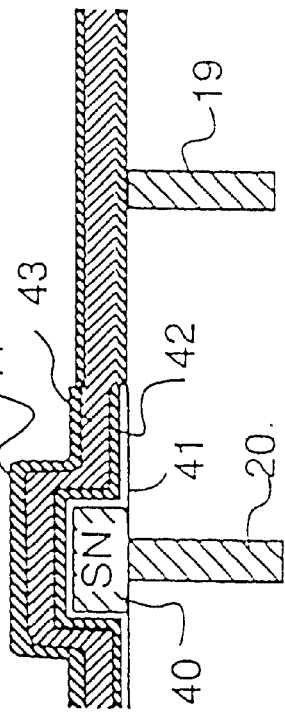
Figure 10C:
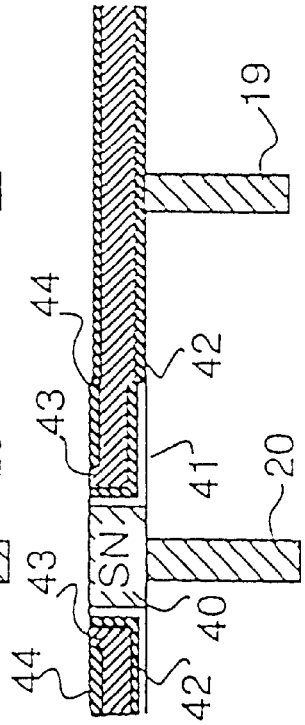
Figure 10D:
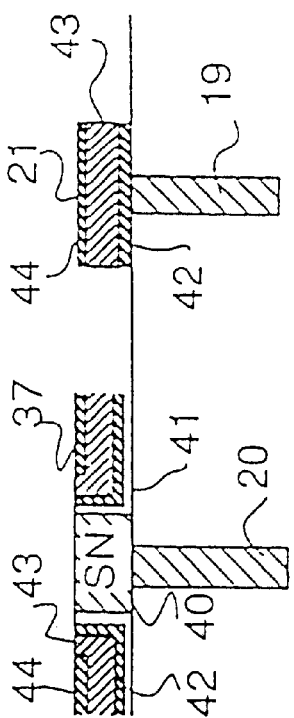

A sixth embodiment of DRAM will be described below. FIG. 9 shows the structure. The sixth embodiment is different from the first embodiment in that a supplementary capacitor is adopted, the supplementary capacitor is formed immediately under an uppermost layer 32, upper and lower capacitors are connected via a connecting plug and the plate electrode 37 of the supplementary capacitor is formed simultaneously with the wire 21 in the same layer of a peripheral circuit using the same mask. As the structure in this embodiment up to a first wiring layer 18 before a capacitor is formed is formed by the same manufacturing method as in the first embodiment, the description is omitted.

Referring to FIG. 10, the manufacturing process of the supplementary capacitor will be described below.

1. First, tungsten is deposited for the storage node (SN) of a supplementary capacitor by sputtering until the film is 0.5 $\mu m$ thick,
2. exposure and development by photolithography are performed and
3. the lower storage node 40 with the dimensions of 0.3 $\mu m \times 0.3$ $\mu m$ is formed on a connecting plug 20 by dry etching.
4. Next, a tantalum pentoxide film 41 is deposited by CVD,
5. exposure and development by photolithography are performed and
6. the tantalum pentoxide film except the required part is removed by dry etching.
7. Next, a titanium nitride film 42 is formed by depositing titanium nitride which is the material of a lower plate electrode 37 and a wire 21 by sputtering (see FIG. 7 together with an enlarged drawing in the lower part of FIG. 7),
8. an aluminum film 43 is formed by depositing aluminum by sputtering,
9. a titanium nitride film 44 is formed by depositing titanium nitride by sputtering again and
10. chemimechanical polishing is applied to it. Polishing is continued until the storage node 40 is exposed. Hereby, a cylindrical capacitor in which the tantalum pentoxide film 41 on the side wall of the storage node 40 is held between the storage node and the plate electrode 37 is formed.
11. Next, exposure and development by photolithography are performed both for the plate electrode 37 and for the wire 21 and
12. the electrode 37 of the capacitor and the wire 21 of the peripheral circuit are separated by dry etching. The following process is approximately the same as the manufacturing process in the first embodiment. The above following process is different from that in the first embodiment in that the dimension of the capacitor is changed and the number of processes is the same.

The dimensions of the upper capacitor are set to 0.3 $\mu m \times 0.3$ $\mu m$ and the height of the storage node is set to 0.5 $\mu m$. Therefore, as the area of the capacitor composed of the upper and lower two parallel layers is 1.44 $\mu m^2$ in total and the tantalum pentoxide film 1.6 nm thick in silicon oxide equivalent. thickness is used, the capacity of the capacitor is 20 fF. This capacity is equivalent to the capacity of a capacitor required for 1 Gbits.

The number of processes in this embodiment is increased by six processes, compared with that in the example described in the first embodiment, however, the number is smaller than that in the prior art. This is because a part of the capacitor layer is formed simultaneously with the wiring layer so that the structure of the part is equal to that of the wiring layer. As described above, if a dielectric film the dielectric constant is middle is used, the problem of the step in the conventional type can be also avoided by adopting a method of forming a part of the capacitor layer simultaneously with the wiring layer so that the structure of the part is equal to that of the wiring layer. Further, 1-Gbit DRAM provided with the simple two-layer capacitor can be manufactured without increasing the number of processes.

<Seventh Embodiment>

Figure 11:
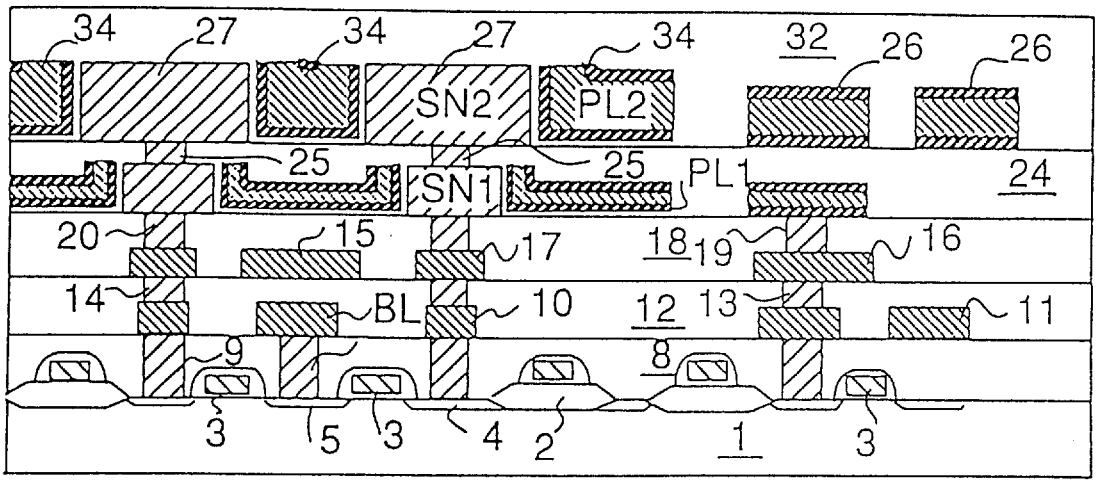
FIG. 11 is a sectional structural view for explaining a seventh embodiment of the present invention.

A seventh embodiment of DRAM will be described below. FIG. 11 shows the structure. The seventh embodiment is different from the sixth embodiment in that a convex portion of a plate electrode 34 in an uppermost layer 32 is flattened by chemimechanical polishing. Hereby, difference in a level on the uppermost layer 32 is removed, a new capacitor is formed on it and the capacitor and the capacitor in the uppermost layer 32 can be connected. In that case, a layer in which the new capacitor is formed is an uppermost layer.

Figure 12:
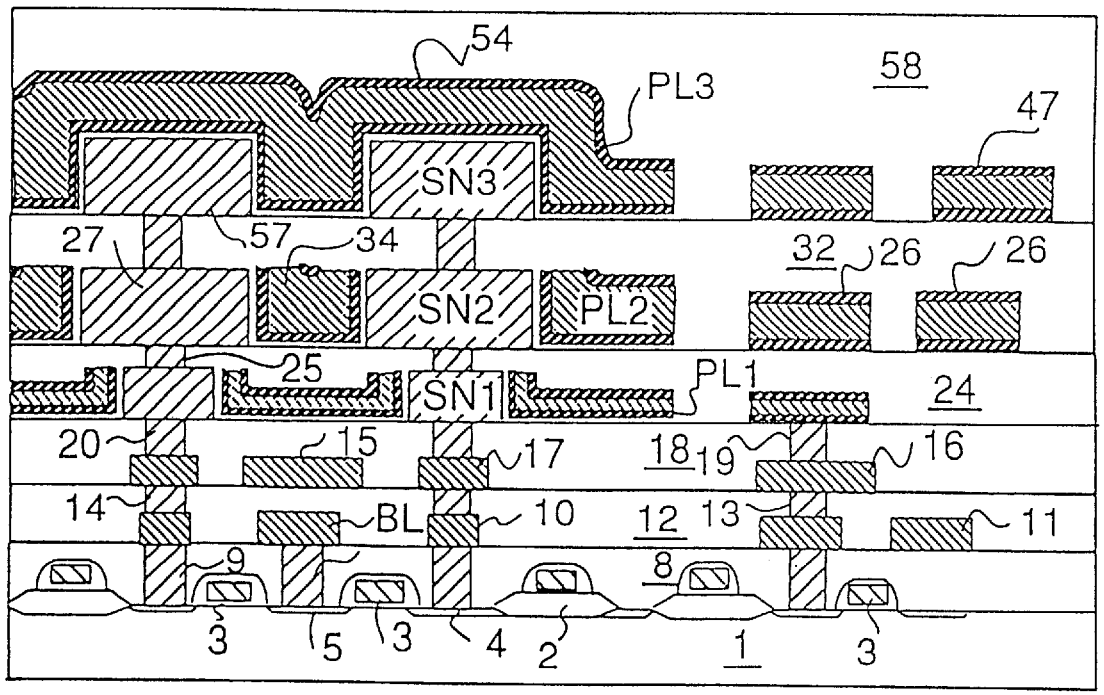
FIG. 12 is a sectional structural view for explaining the seventh embodiment of the present invention.

FIG. 12 shows an example in which a capacitor is further formed on the uppermost layer 32 and a new uppermost wiring layer 58 is formed. The convex portion of the plate electrode 34 in the wiring layer 32 is flattened until a storage node 27 is exposed and the capacitor is provided with structure in which a dielectric film vertically formed on the side of the storage node 27 is held between the plate electrode 34 and the storage node 27. The capacitor in the uppermost wiring layer 58 is formed in the same way as the capacitor in the uppermost layer 32 in the first embodiment.

If the capacitor is not required to be added on the wiring layer 32, a final passivated film is formed after the convex portion of the plate electrode 34 is polished. In this case, as the final passivated film is applied after the wiring layer is flattened, the property of passivation (a protective characteristic) is enhanced.

<Eighth Embodiment>

Figure 13:
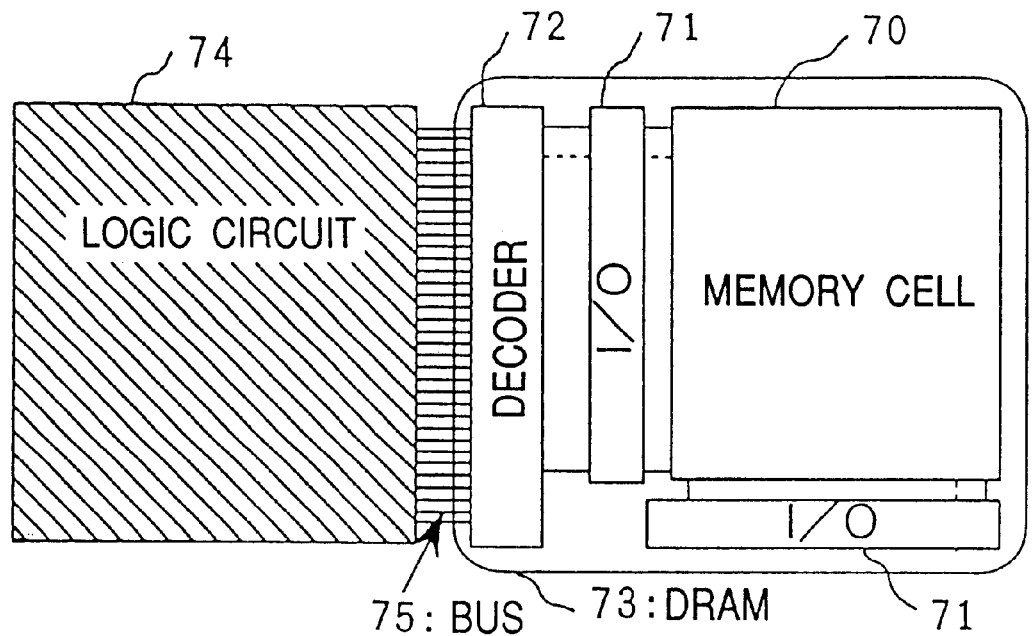
FIG. 13 is a block diagram for explaining an eighth embodiment of the present invention.
Figure 14:
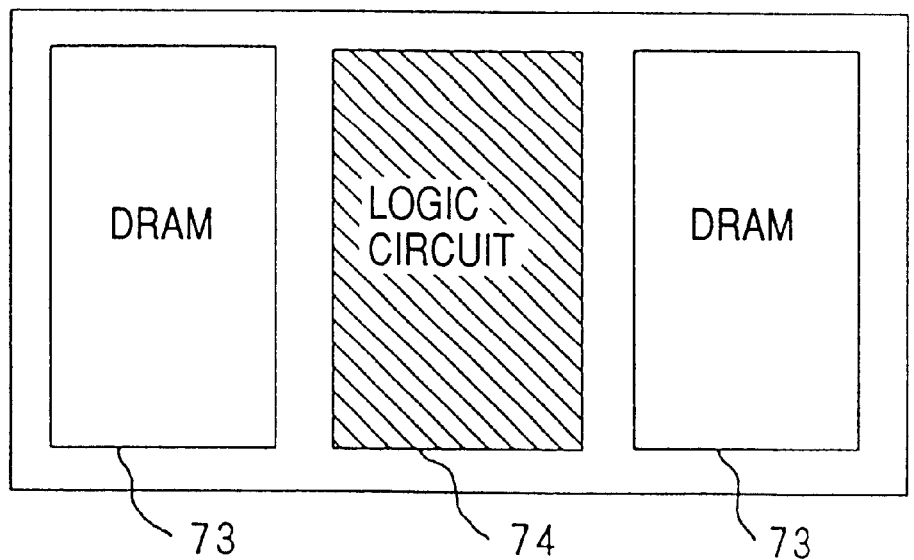
FIG. 14 is a layout view for explaining the eighth embodiment of the present invention.

An example of a semiconductor integrated circuit including DRAM and a logical circuit will be described below. FIG. 13 is a block diagram showing one chip and FIG. 14 is a layout drawing. The circuit is for image processing and DRAM 73 composed of a memory cell 70, an I/O device 71 and a decoder 72 and a logical circuit 74 are connected via a 512-bit bus 75. 512-bit data is collectively sent from DRAM 73 to the logical circuit 74.

Figure 15:
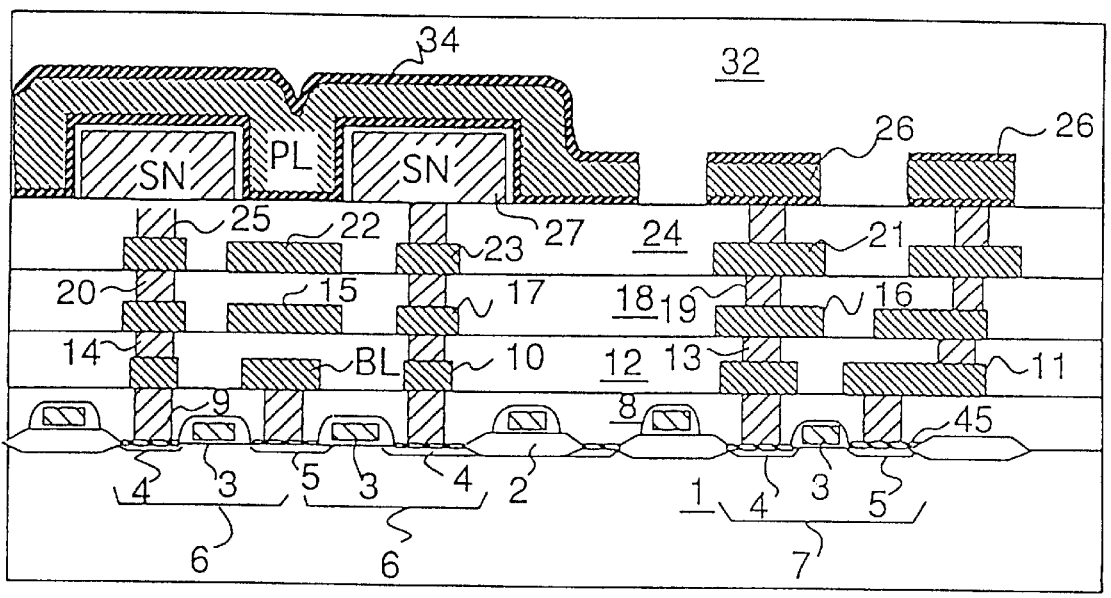
FIG. 15 is a sectional structural view for explaining the eighth embodiment of the present invention.

FIG. 15 shows a part of the circuit and shows one MOS transistor constituting two memory cells and a logical circuit. The sectional structure is approximately the same as that shown in FIG. 1, memory cells are located in the center and on the left side and the logical circuit is located on the right side. The sectional structure in this embodiment is different from that shown in FIG. 1 in that the diffusion layers 4 and 5 of a MOS transistor 7 in the logical circuit and wires 26 in an uppermost layer 32 are respectively connected. The structure viewed from the top of the memory cell is the same as that shown in FIG. 2. In this embodiment, memory capacity is also set to 256 Mbits and x and y (shown FIG. 2) on the plane of projection of the capacitor are respectively set to 0.85 μm and 0.65 μm.

The manufacturing process is approximately the same as in the first embodiment and in each wiring layer, a connecting plug and a wire are simultaneously formed in the memory cell and the logical circuit by the same material so that they have the same structure. In this embodiment, particularly to reduce contact resistance in a connection with each diffusion layer, a tungsten film 454 is piled. A passivated film 8 is formed by heating phosphor silicate glass (PSG) at 450° C. and reflowing processing is not applied. The passivated film is flattened by applying chemical mechanical polishing (CMP). In the whole manufacturing process, heating temperature is 500° C. or less. In addition, as the process in this embodiment are different from those in the above embodiments only in the shape and number of connecting plugs and wires, the description of the manufacturing process in this embodiment is omitted to avoid repetition.

Figure 26:
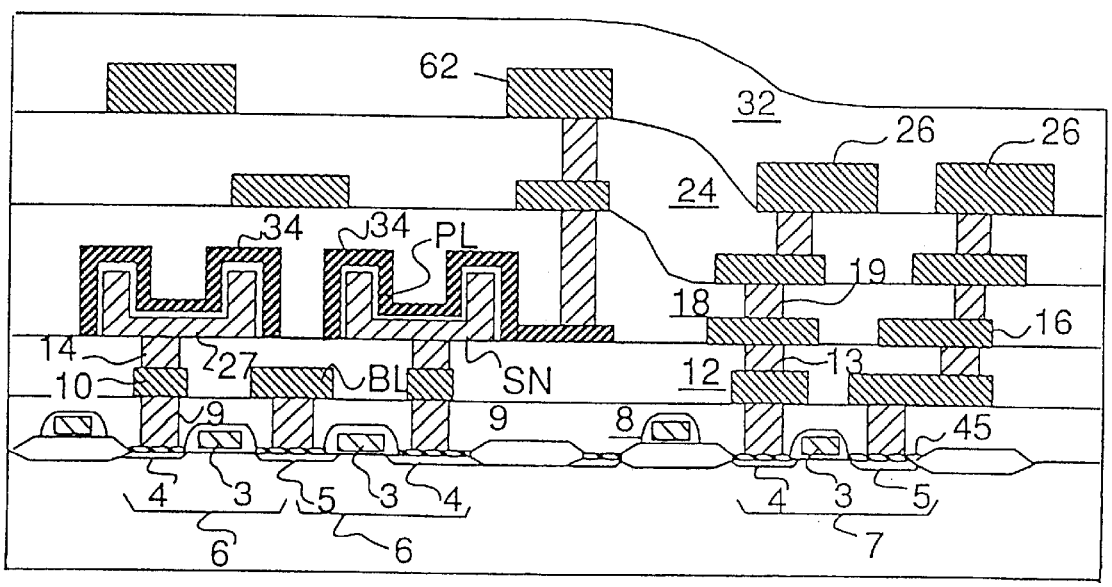
FIG. 26 is a sectional structural view for explaining an example of conventional type semiconductor integrated circuit and method of manufacturing it.

If the present invention is compared with the conventional type shown in FIG. 26 (the example guessed from the quoted example shown in FIG. 24), the number of manufacturing processes according to the present invention is reduced to eleven as in the first embodiment compared with twenty in the conventional type is 20. (As the process in the conventional type is approximately the same as that described in the first embodiment, the description is omitted.) The other general characteristics are also the same as 1), 2) and 3) described in the first embodiment.

In the above example, DRAM and the logical circuit are included. Needless to say, the similar effect can be also obtained in a semiconductor integrated circuit including a static random access memory (SRAM) and a flash memory (a nonvolatile memory) in addition to a logical circuit.

<Ninth Embodiment>

Figure 16:
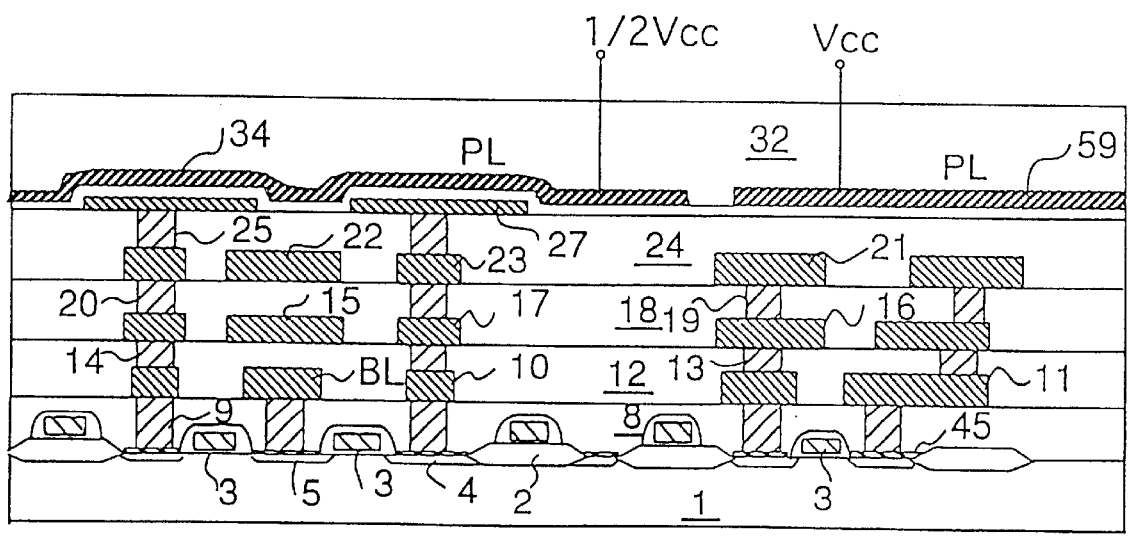
FIG. 16 is a sectional structural view for explaining a ninth embodiment of the present invention.

A second example of a semiconductor integrated circuit including DRAM and a logical circuit will be described below. FIG. 16 shows the structure. The ninth embodiment is different from the eighth embodiment in that the material of the dielectric film of a capacitor is changed from tantalum pentoxide to lead zirconate titanate (PZT) which has the high dielectric constant, the structure of the capacitor is a plate type and the approximately overall surface up to a peripheral circuit is coated with a plate electrode of the capacitor. The structure in this embodiment is formed by the same manufacturing method as in the eighth embodiment until a second wiring layer 24 is formed before the capacitor is formed and a capacitor in a third wiring layer 32 is formed by the approximately same manufacturing method as in the second embodiment.

The ninth embodiment is different in that when a plate electrode is formed, the pattern of a mask is changed and an independent plate electrode (to which supply voltage Vcc is supplied) is formed in a logical circuit. However, the plate electrode of the capacitor and the plate electrode of the logical circuit are simultaneously formed. As the ninth embodiment is the same as the second embodiment at the other points, the description is omitted.

High resistance to a radiation can be obtained as in the second embodiment.

<Tenth Embodiment>

Figure 17:
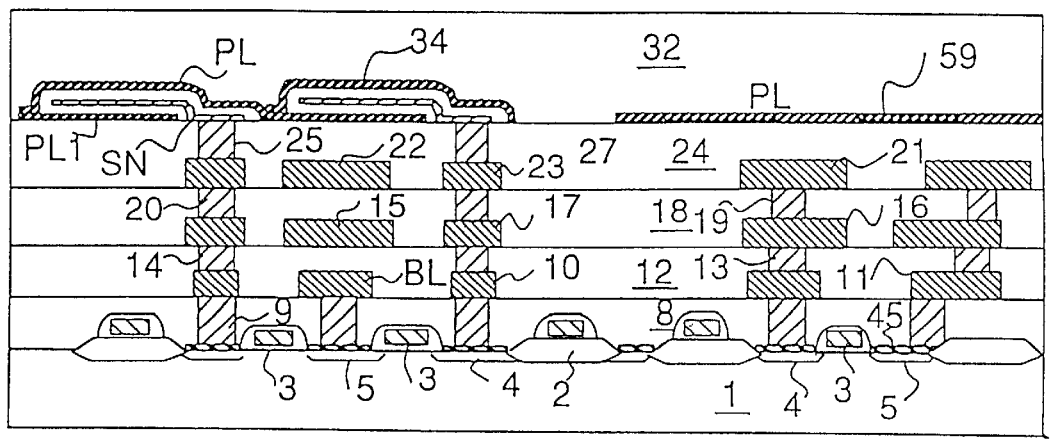
FIG. 17 is a sectional structural view for explaining a tenth embodiment of the present invention.

A third example of the semiconductor integrated circuit including DRAM and a logical circuit will be described below. FIG. 17 shows the structure. The tenth embodiment is different from the ninth embodiment in that the material of the dielectric film of a capacitor is changed from lead titanate of which effective thickness is 0.36 μm by CVD using organic metal to lead titanate of which effective thickness is 0.50 μm formed by simpler sputtering and the structure of the capacitor is a two-layer planar type. Therefore, a plate electrode (PL) is formed in upper and lower two layers 35 and 34 and a storage node (SN) 27 is arranged between them. As the structure in this embodiment is formed by the same manufacturing method as in the eighth embodiment until a second wiring layer 24 is formed before the capacitor is formed and a capacitor in a third wiring layer 32 is formed by the same manufacturing method as in the third embodiment, the description is omitted.

In this embodiment as in the third embodiment, the simple planar type of two-layer capacitor can be also realized without increasing the number of processes. In this embodiment, structure in which the plate electrode is held between the two layers of the storage node can be also adopted.

<Eleventh Embodiment>

Figure 18:
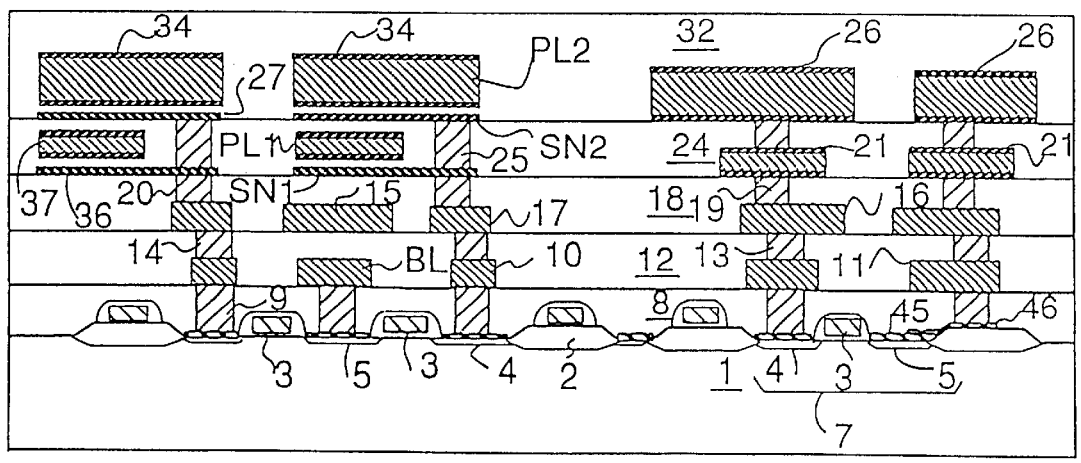
FIG. 18 is a sectional structural view for explaining an eleventh embodiment of the present invention.

A fourth example of a semiconductor integrated circuit including DRAM and a logical circuit will be described below. FIG. 18 shows the structure. The eleventh embodiment is different from the tenth embodiment in that a supplementary capacitor is formed in a wiring layer 24 immediately under an uppermost layer 32, both main and supplementary capacitors are a planar type, both capacitors are connected via a connecting plug, the respective plate electrodes 34 and 37 of both capacitors are respectively formed simultaneously with each wire 26 and 21 in the same layer of a logical circuit using the same mask and further, a local wire 46 is added to the logical circuit. The local wire 46 is formed by depositing titanium silicide (TiSi$_2$) in a predetermined part of a tungsten film 45 on a transistor 7.

As the structure in this embodiment is formed by the same manufacturing method as in the eighth embodiment except the formation of the local wire 46 until a first wiring layer 18 is formed before the capacitor is formed and the capacitors in the second wiring layer 24 and the third wiring layer 32 are formed by the approximately same manufacturing method as in the fourth embodiment, the description is omitted.

As in the fourth embodiment, the simple planar type of two-layer capacitor can be realized without increasing the number of processes.

<Twelfth Embodiment>

Figure 19:
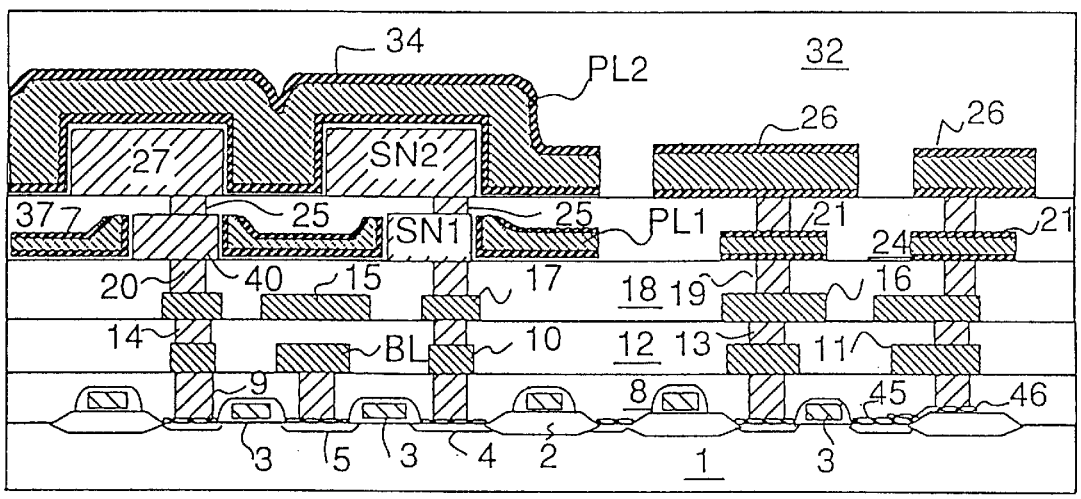
FIG. 19 is a sectional structural view for explaining a twelfth embodiment of the present invention.

A fifth example of a semiconductor integrated circuit including DRAM and a logical circuit will be described below. FIG. 19 shows the structure. The twelfth embodiment is different from the eighth embodiment in that a supplementary capacitor is formed immediately under an uppermost layer, upper and lower capacitors are connected via a connecting plug and the plate electrode 37 of the supplementary capacitor is formed simultaneously with a wire 21 in the same layer of a logical circuit using the same mask. As the structure in this embodiment is formed by the same manufacturing method as in the eighth embodiment up to a first wiring layer 18 before the capacitor is formed and the capacitors in a second wiring layer 24 and in a third wiring layer 32 are formed by the approximately same manufacturing method as in the sixth embodiment, the description is omitted.

As in the sixth embodiment, the semiconductor integrated circuit including the logical circuit and provided with 1-Gbit DRAM provided with the simple two-layer capacitor can be manufactured without increasing the number of processes.

<Thirteenth Embodiment>

Figure 20:
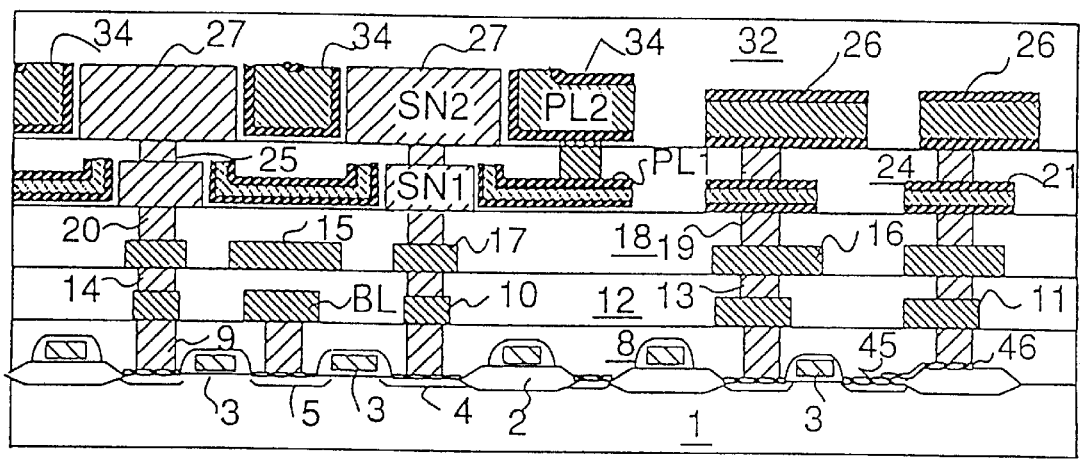
FIG. 20 is a sectional structural view for explaining a thirteenth embodiment of the present invention.

A sixth example of a semiconductor integrated circuit including DRAM and a logical circuit will be described below. FIG. 20 shows the structure. The thirteenth embodiment is different from the twelfth embodiment in that a convex portion of a plate electrode 34 in an uppermost layer 32 is flattened by a chemical mechanical polishing method. Hereby, difference in a level on the uppermost layer 32 is removed, a new capacitor is formed on it and the capacitor and a capacitor in the uppermost layer 32 can be connected. In that case, a layer in which the new capacitor is formed is an uppermost layer.

Figure 21:
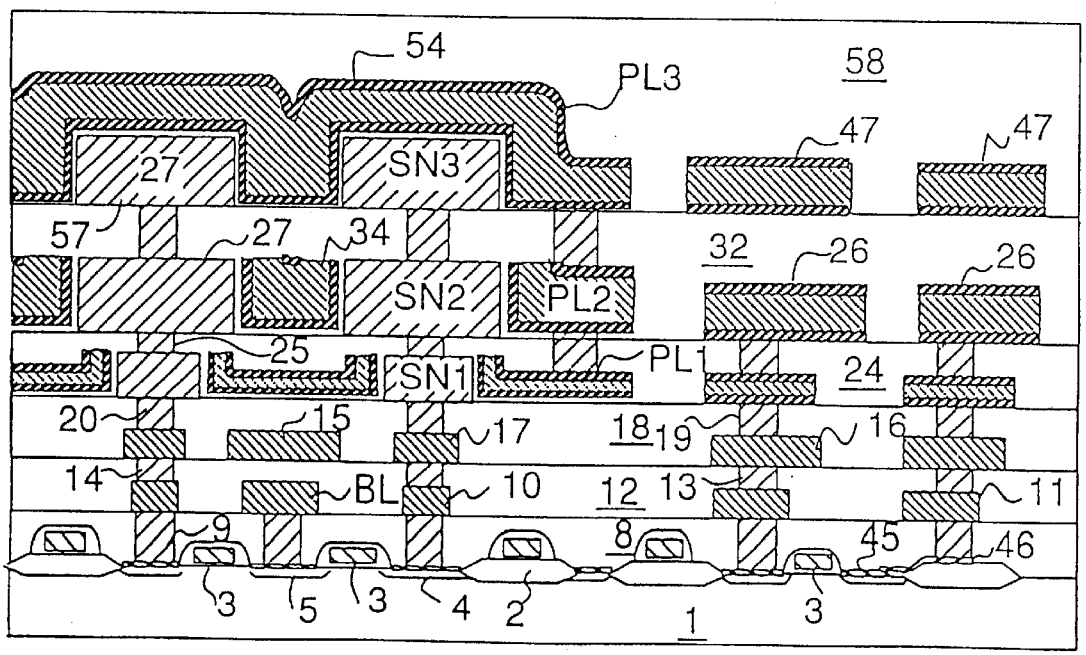
FIG. 21 is a sectional structural view for explaining the thirteenth embodiment of the present invention.

FIG. 21 shows an example in which a capacitor is further formed on the uppermost layer 32 and a new uppermost wiring layer 58 is formed. The convex portion of the plate electrode 34 in the wiring layer 32 is flattened until a storage node 27 is exposed and a capacitor with structure in which a dielectric film vertically formed on the side of the storage node 27 is held between the plate electrode 34 and the storage node is formed. The capacitor in the uppermost wiring layer 58 is formed according to the same procedure as in the capacitor in the uppermost layer 32 in the eighth embodiment.

If a capacitor is not required to be added on the wiring layer 32, a final passivated film is formed after the convex portion of the plate electrode 34 is polished. In this case, as the convex portion is flattened and the final passivated film is applied, the property of passivation (the protective characteristic) is enhanced, compared with a case that the film is applied with the convex portion.

<Fourteenth Embodiment>

Figure 22:
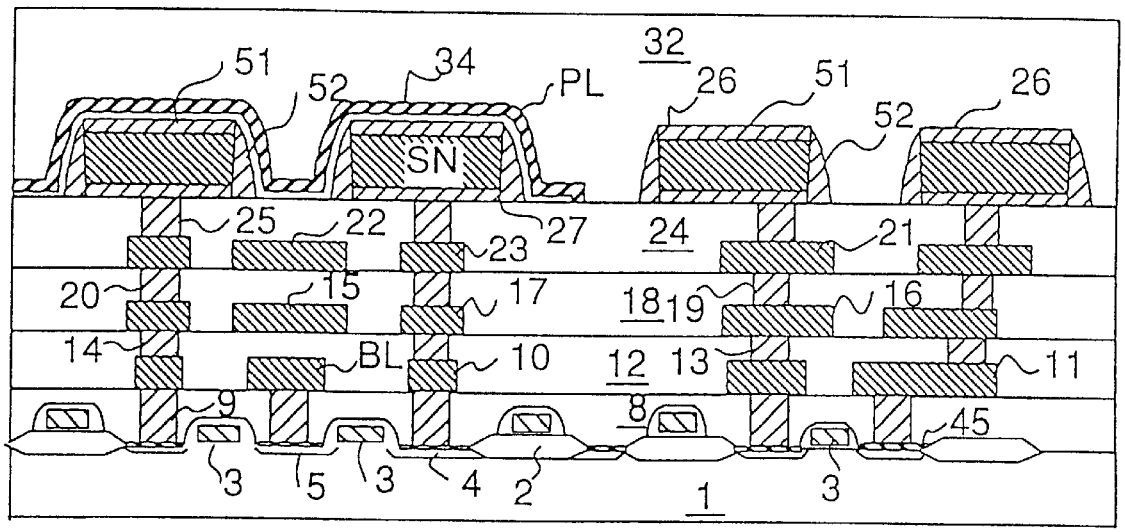
FIG. 22 is a sectional structural view for explaining a fourteenth embodiment of the present invention.

A seventh example of a semiconductor integrated circuit including DRAM and a logical circuit will be described below. FIG. 22 shows the structure. The fourteenth embodiment is different from the eighth embodiment in that a storage node 27 and a wire 26 are simultaneously and in common formed in an uppermost layer 32 and afterward, a plate electrode 34 is formed. (In the eighth embodiment, the storage node 27 is individually formed before and afterward, the plate electrode 34 and the wire 26 are simultaneously and in common formed.)

The capacitor is formed according to the following procedure:

1. First, a titanium nitride film is formed according to the same procedure as the method of forming the lower bit line layer 12 and the wiring layers 18 and 24,
2. an aluminum film is formed on it,
3. a tungsten film 51 is further formed on it and
4. exposure and development by photolithography are performed. At that time, as afterward, a connecting hole is not formed in an insulating film on the following plate electrode 34 in which difference in a level is made, and a focus has only to be brought on the flattened insulating film of the wiring layer 24.
5. Next, wires in which W, Al and TiN are laminated are formed by dry etching. At that time, a wire on a connecting plug 25 is a storage node (SN) 27. That is, the storage node 27 of a capacitor and a wire 26 of a logical circuit are simultaneously formed using the same mask.
6. Next, tungsten is deposited and
7. is etched back. (After a photoresist the etching speed of which is approximately the same is applied, the overall surface is etched and the convex portion of a tungsten film 51 is removed.) Hereby, a tungsten side wall 52 is formed on the storage node 27 of the capacitor and the surface of the storage node 27 is coated with tungsten. The reason why tungsten is used is that tungsten can keep satisfactory contact with the dielectric film of the capacitor and reliability can be enhanced. Therefore, other material which can secure reliability may be adopted without limiting the material of the side wall 52 and material on the storage node 27 to tungsten. Material suitable for a used dielectric film is selected and used.
8. Next, tantalum pentoxide is deposited and
9. exposure and development by photolithography are performed. At that time, a focus has only to be brought on the insulating film of the flattened wiring layer 24.
10. Next, the tantalum pentoxide film except the required part is removed by dry etching.
11. Next, a titanium nitride film is formed,
12. the titanium nitride film except the required part is removed by dry etching and a plate electrode (PL) 34 is formed.

The number of processes in this embodiment is increased by one process, compared with that in the eighth embodiment, however, as curvature at the end of the upper part of the storage node 27 is smaller than that in the eighth embodiment and electrostatic focusing is tempered, the reliability of the capacitor can be enhanced. As a concave portion is slightly tilted (partly tapered) when a final passivated film is deposited, the embeddability of the passivated film can be enhanced.

<Fifteenth Embodiment>

Figure 23:
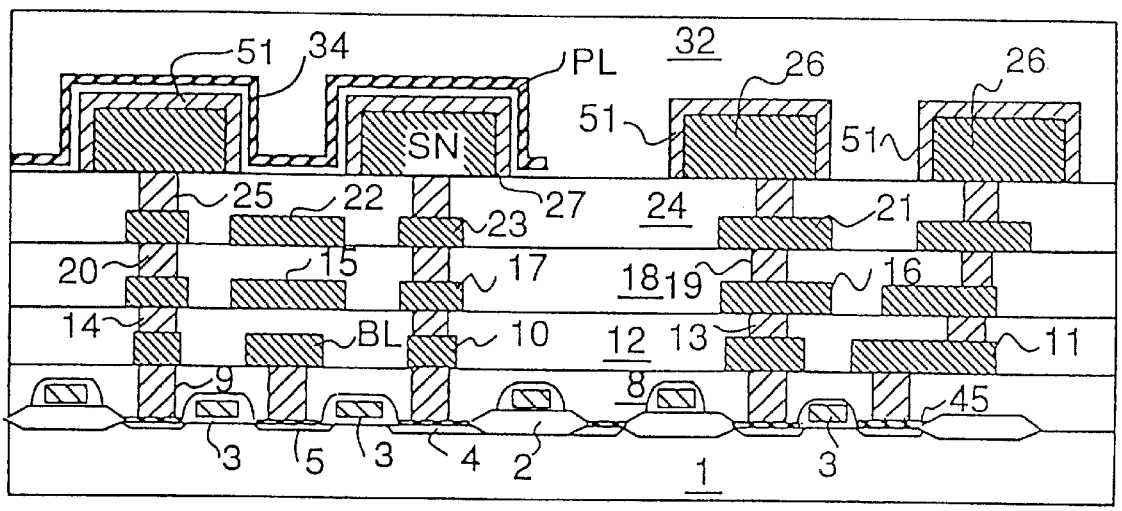
FIG. 23 is a sectional structural view for explaining a fifteenth embodiment of the present invention.

An eighth example of a semiconductor integrated circuit including DRAM and a logical circuit will be described below. FIG. 23 shows the structure. The fifteenth embodiment is different from the eighth embodiment in that a storage node 27 and a wire 26 in an uppermost layer 34 are simultaneously and in common formed and afterward, a plate electrode 34 is formed.

A capacitor is formed according to the following procedure:

1. First, a titanium nitride film is formed according to the same procedure as a method of forming a lower bit line layer 12 and wiring layers 18 and 24,
2. an aluminum film is formed on it,
3. exposure and development by photolithography are performed and
4. a wire in which Al and TiN are laminated is formed by dry etching. At that time, the wire on a connecting plug 25 is a storage node (SN) 27.
5. Next, tungsten is formed on the storage node 27 and the wire 26 by selective CVD and the following processes are the same as the processes 8 to 12 in the fourteenth embodiment.

The fifteenth embodiment is different from the fourteenth embodiment in a method of forming a film which coats the storage node 27 and the wire 26 and in this embodiment, the number of processes in the fourteenth embodiment can be reduced.

According to a semiconductor integrated circuit and a method of manufacturing it according to the present invention, as the capacitor of a memory cell in DRAM is formed in an uppermost layer and is connected to the diffusion layer of a transistor via plugs and pads, the problem of difference in a level between the memory cell and a peripheral circuit can be solved without increasing the number of processes. Therefore, the problem of the shortage of exposure and conduction respectively caused by the difference in a level can be avoided. As the approximately overall plane of projection of a memory cell can be utilized for the plane of projection of the capacitor and the plane of projection of the capacitor is widened, a desired value of capacity can be obtained with simple structure in which the number of processes is reduced. Further, the number of processes can be reduced by forming either the plate electrode or the storage node of the capacitor and the wire of the peripheral circuit simultaneously and in common. The enhancement of the manufacturing yield and the low cost can be realized by the reduction of the number of processes. A semiconductor integrated circuit of which operating speed is fast can be manufactured by lowering temperature to be applied in the manufacturing process.

The above effect can be similarly obtained in a semiconductor integrated circuit including DRAM and a logical circuit and the circuit can be supplied at a low cast.

What is claimed is:

1. A semiconductor integrated circuit device in which plural memory cells each of which is constituted by combining a MOS field effect transistor comprised of one gate electrode and two diffusion layers (a drain area and a source area) and a capacitor for storing electric charges in which a dielectric film is held between a storage node and a plate electrode are arrayed in a matrix on a semiconductor substrate, a word line of wires from a predetermined external circuit to an individual one of said memory cells is arranged in a passivated insulating film layer, a bit line is arranged in a bit line layer and the other wires including a wire to a plate electrode and an internal wire between said transistor and said capacitor of an individual memory cell are arranged in plural metal wiring layers, wherein:

said capacitor is formed in the uppermost layer of said plural metal wiring layers; and said storage node is connected to said diffusion layer via a contact plug to said diffusion layer, pads and plugs arranged in the bit line layer and each wiring layer.

2. A semiconductor integrated circuit device according to claim 1, wherein said capacitor is provided with structure in which the storage node is surrounded by the plate electrode.

3. A semiconductor integrated circuit device according to claim 1, wherein said capacitor is provided with structure in which the plate electrode is surrounded by the storage node.

4. A semiconductor integrated circuit device according to any of claims 1 or 2, wherein the plate electrode of said capacitor covers the approximately overall surface of a memory cell.

5. A semiconductor integrated circuit device according to any of claims 1 or 2, wherein the plate electrode of said capacitor covers the approximately overall surface of said semiconductor integrated circuit.

6. A semiconductor integrated circuit device according to claim 1, wherein said capacitor is provided with structure in which a dielectric film is held between the sides approximately perpendicular to the flat surface of said semiconductor integrated circuit of said storage node and said plate electrode.

7. A semiconductor integrated circuit device according a to any of claims 1 or 3, wherein:

a dynamic random access memory (DRAM) composed of a memory array, a decoder and an I/O device and a logical circuit for supplying data and an address to said DRAM are provided; and said DRAM and said logical circuit share a metal wiring layer.

8. A semiconductor integrated circuit device according to claim 7, wherein the structure in the direction of the thickness of the plate electrode of said capacitor is equal to the structure in the direction of the thickness of the wire of said logical circuit in a metal wiring layer in which said plate electrode is formed.

9. A semiconductor integrated circuit device according to claims 1 or 2, wherein said storage node and a plug connected to said storage node are made of material including at least tungsten.

10. A semiconductor integrated circuit device according to claims 1 or 2, wherein said plate electrode is made of material including at least titanium.

11. A semiconductor integrated circuit device according to claim 7 or wherein a metal film made of material including at least tungsten is formed on the diffusion layers of said MOS transistor constituting a memory cell and diffusion layers of a MOS transistor constituting a logical circuit.

12. A semiconductor integrated circuit device according to claim 7, wherein the height of a final protective film formed in an uppermost metal wiring layer is approximately equal in DRAM and said logical circuit.

13. A semiconductor integrated circuit device according to claim 4 or 5, wherein said plate electrode in the uppermost layer functions as a protective film for preventing a radiation.

* * * * *